(12) United States Patent
Nagata

(10) Patent No.: US 7,394,297 B2
(45) Date of Patent: Jul. 1, 2008

(54) LOGIC GATE WITH REDUCED SUB-THRESHOLD LEAK CURRENT

(75) Inventor: Kyoichi Nagata, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 59 days.

(21) Appl. No.: 11/399,334

(22) Filed: Apr. 7, 2006

(65) Prior Publication Data

US 2006/0232305 A1 Oct. 19, 2006

(30) Foreign Application Priority Data

Apr. 8, 2005 (JP) .............................. 2005-111853

(51) Int. Cl.
 *H03B 21/00* (2006.01)
(52) U.S. Cl. ........................................ 327/107; 326/112
(58) Field of Classification Search ................. None
 See application file for complete search history.

(56) References Cited

U.S. PATENT DOCUMENTS

| | | | | |
|---|---|---|---|---|
| 5,055,836 A * | 10/1991 | Kane ........................... 340/2.2 |
| 5,319,256 A * | 6/1994 | Koyanagi et al. ........... 327/530 |
| 5,426,385 A * | 6/1995 | Lai ............................... 327/57 |
| 5,821,769 A * | 10/1998 | Douseki ....................... 326/34 |
| 6,087,886 A * | 7/2000 | Ko .............................. 327/408 |
| 6,127,872 A * | 10/2000 | Kumata ....................... 327/276 |
| 6,133,762 A * | 10/2000 | Hill et al. .................... 326/119 |
| 6,218,707 B1 * | 4/2001 | Soldavini .................... 257/371 |
| 6,288,581 B1 * | 9/2001 | Wong .......................... 327/108 |
| 6,414,363 B1 | 7/2002 | Mizuguchi |
| 6,492,860 B1 * | 12/2002 | Ramakrishnan ............. 327/404 |
| 6,809,953 B2 * | 10/2004 | Toyoda et al. ............... 365/145 |
| 6,933,744 B2 * | 8/2005 | Das et al. ...................... 326/17 |
| 2003/0095003 A1 * | 5/2003 | Li et al. ....................... 330/253 |

FOREIGN PATENT DOCUMENTS

| | | |
|---|---|---|
| JP | 09-121152 | 5/1997 |
| JP | 11-088140 | 3/1999 |
| JP | 2001-143477 | 5/2001 |
| JP | 2001-168209 | 6/2001 |
| JP | 2001-237685 | 8/2001 |

OTHER PUBLICATIONS

Sakurai, "Low Power Design of Digital Circuits," International Symposium on Key Technologies for Future VLSI Systems, Jan. 2001, pp. 1-5.

* cited by examiner

*Primary Examiner*—Cassandra Cox
(74) *Attorney, Agent, or Firm*—Foley & Lardner LLP

(57) ABSTRACT

The logic gate of the present invention is of a configuration that includes a first transistor, a second transistor, and a connection-switching unit. The first transistor receives a first voltage at its source, a first input signal at its gate, and supplies a first output signal from its drain. The second transistor receives a second voltage that is lower than the first voltage at its source, receives a second input signal at its gate, and supplies a second output signal from its drain. The connection-switching unit is connected between the drains of the first transistor and the second transistor for connecting and cutting off the first transistor and the second transistor.

13 Claims, 32 Drawing Sheets

FIG.4
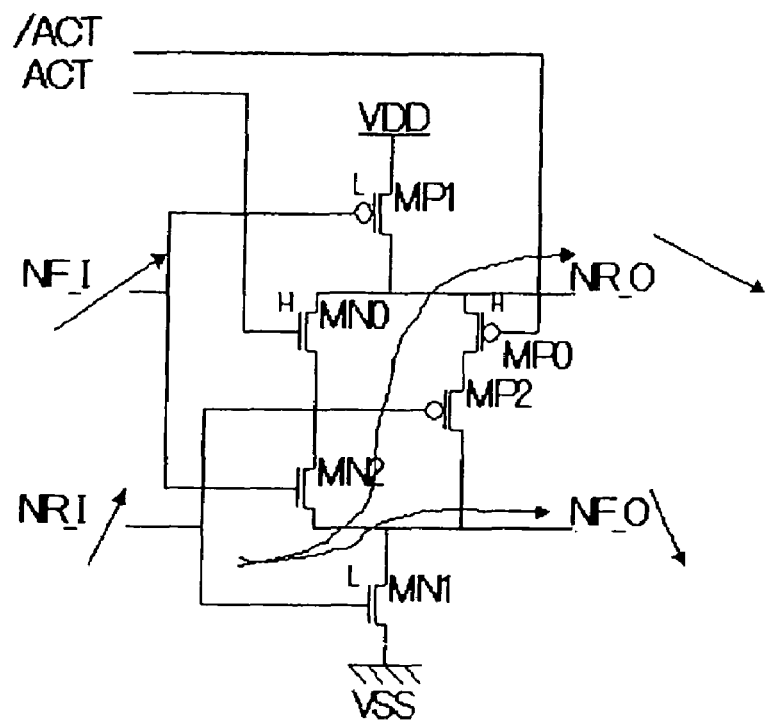
The fall of the power supply ≒0
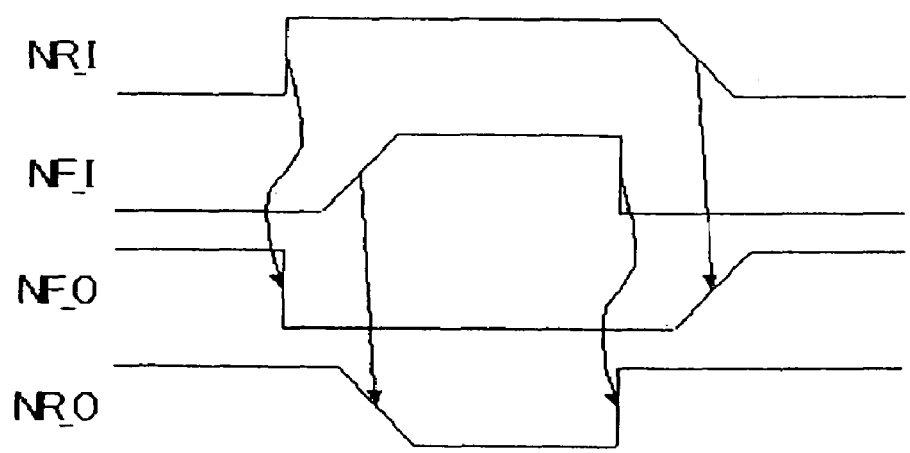

FIG.5
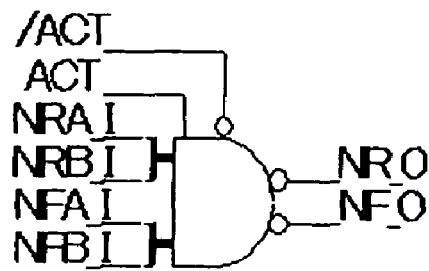
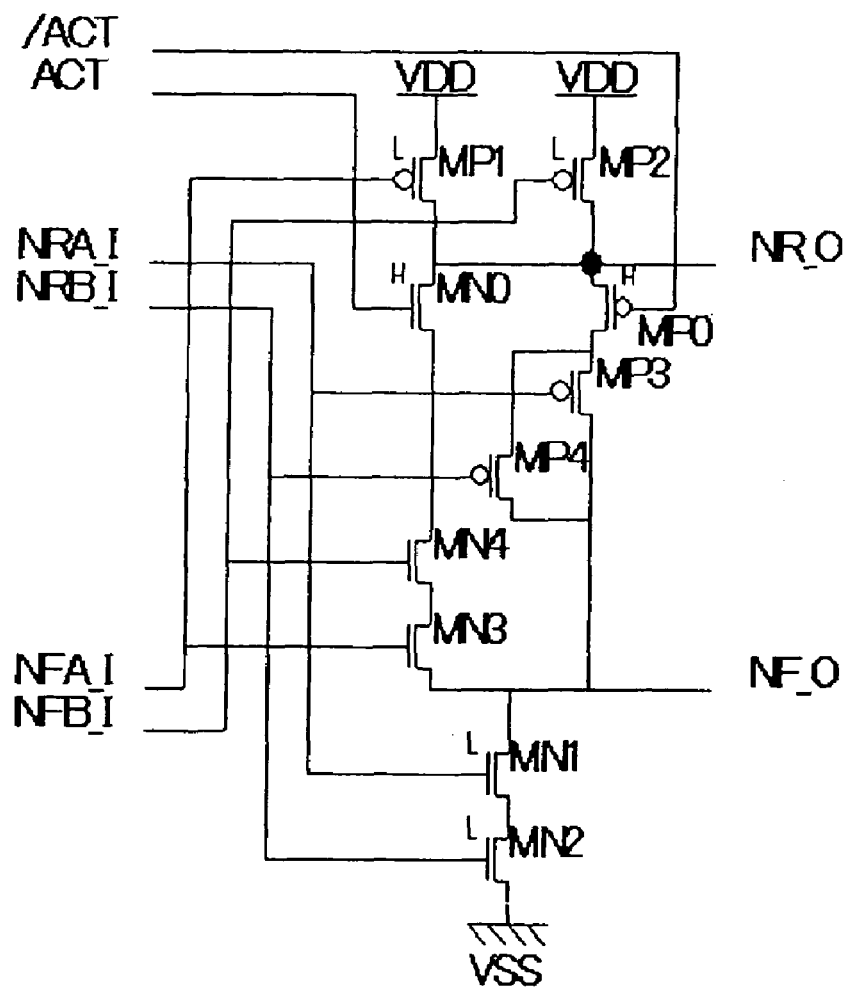

FIG.6
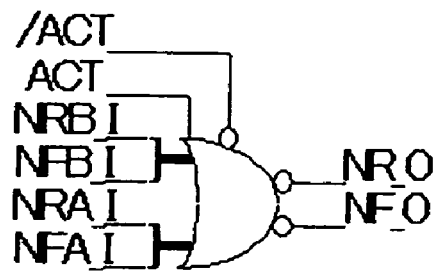
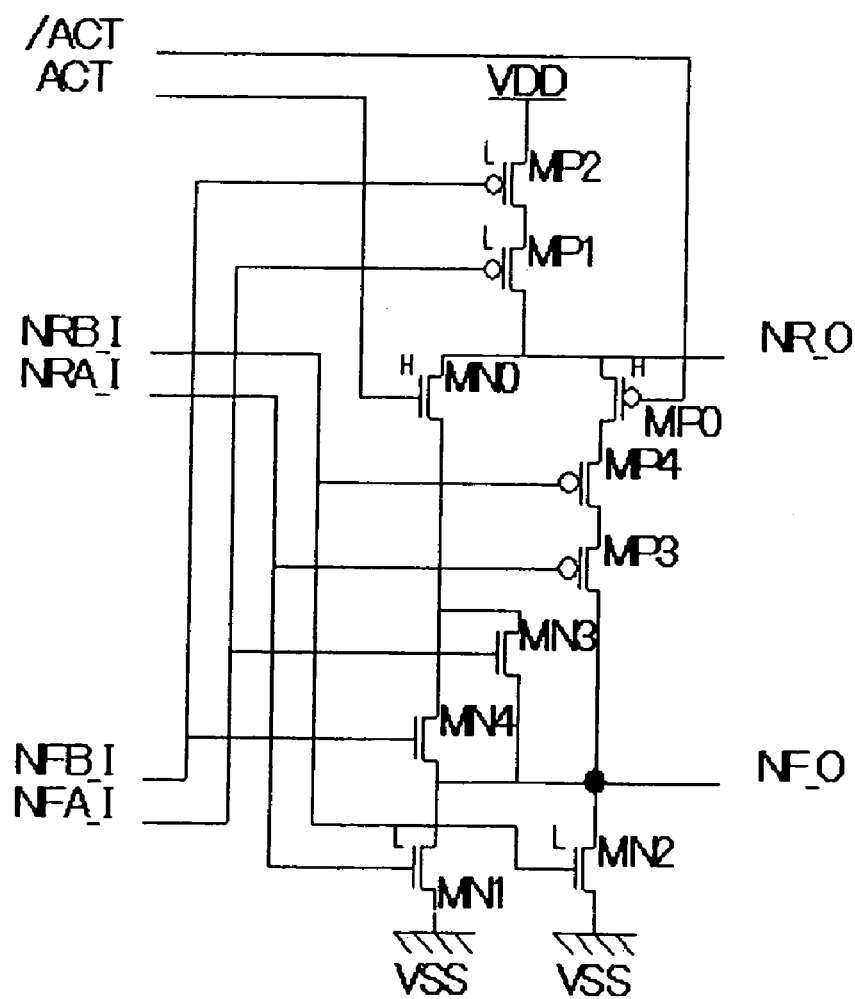

FIG.7
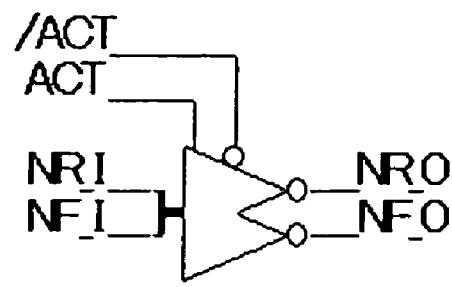
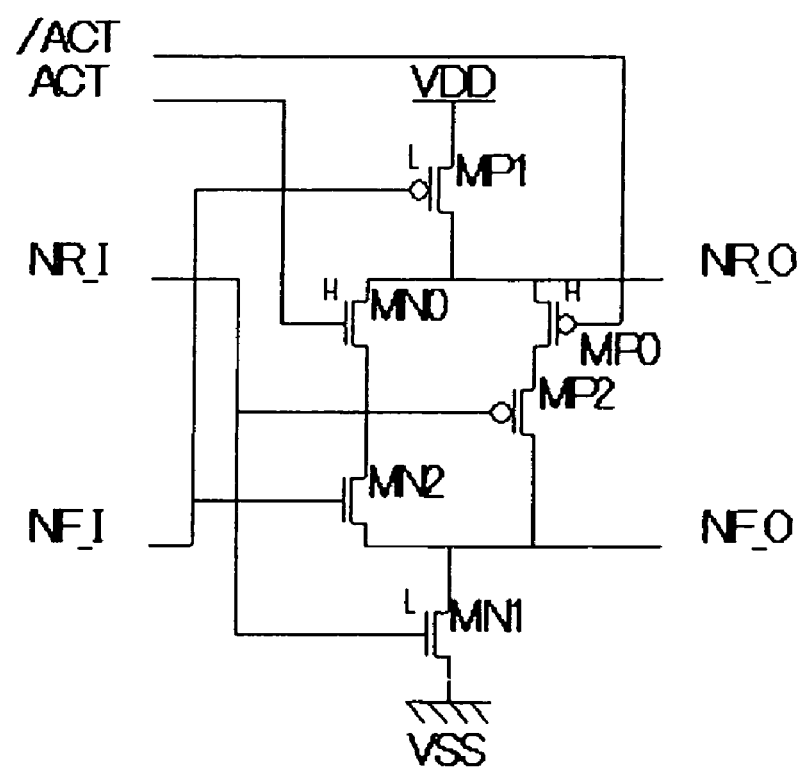

FIG.8
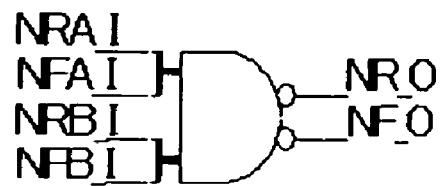
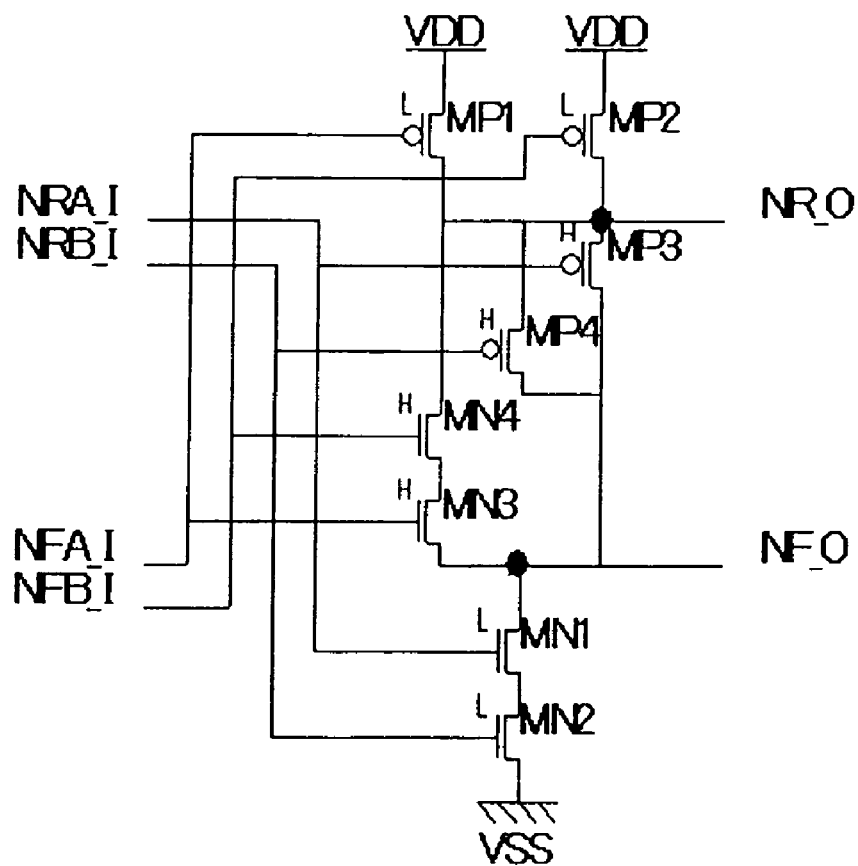

FIG.9
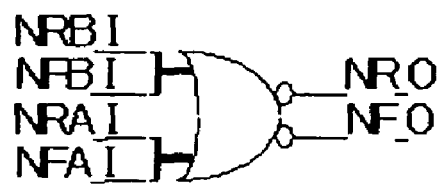
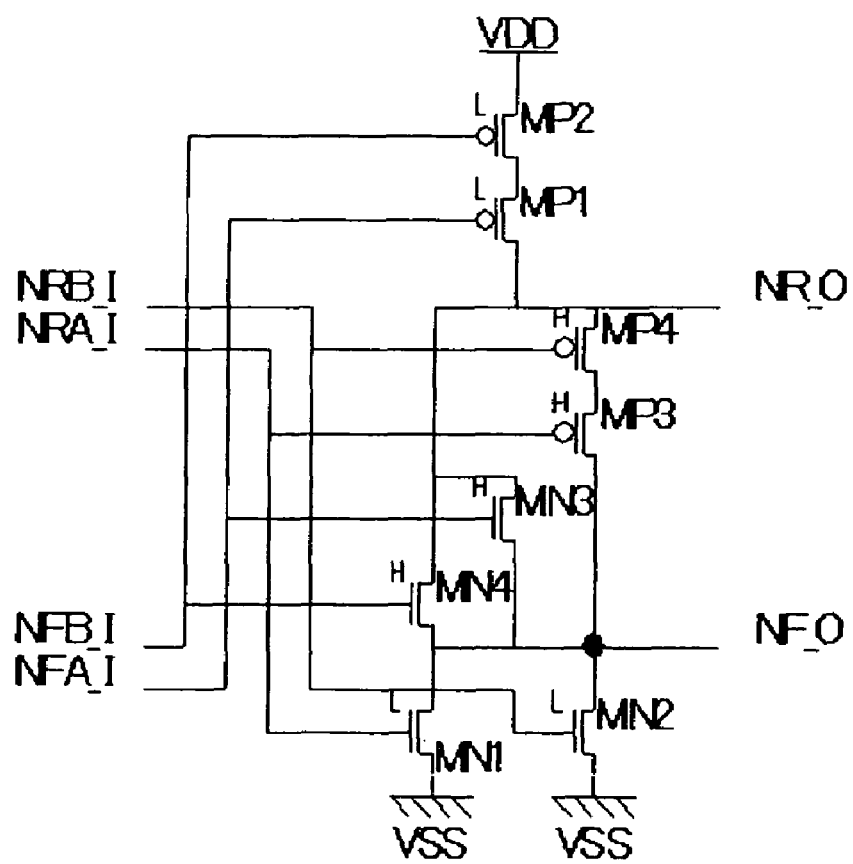

FIG.10
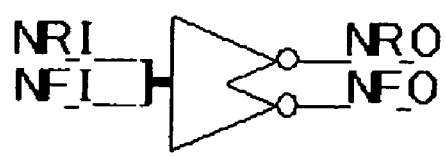
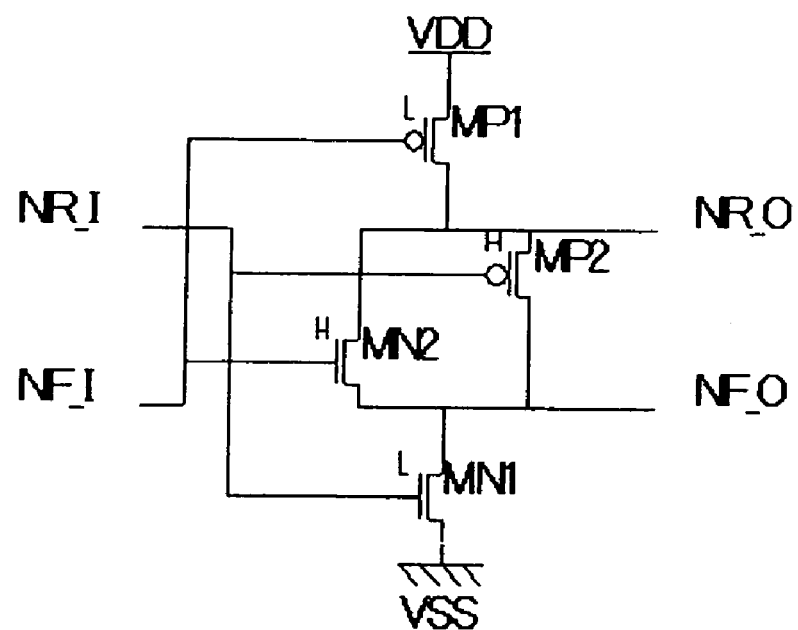

FIG.11 NAND_A 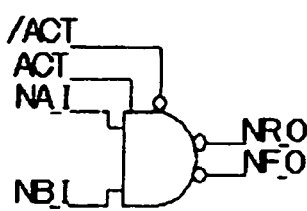
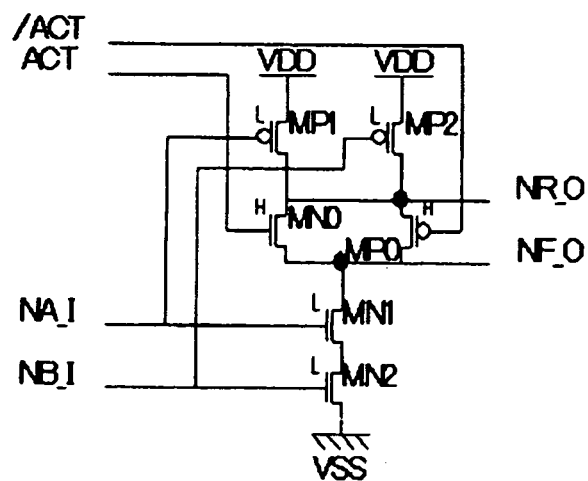
FIG.12 NOR_A 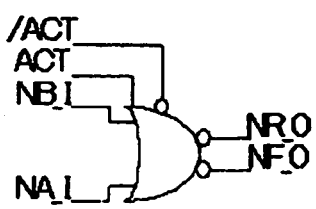
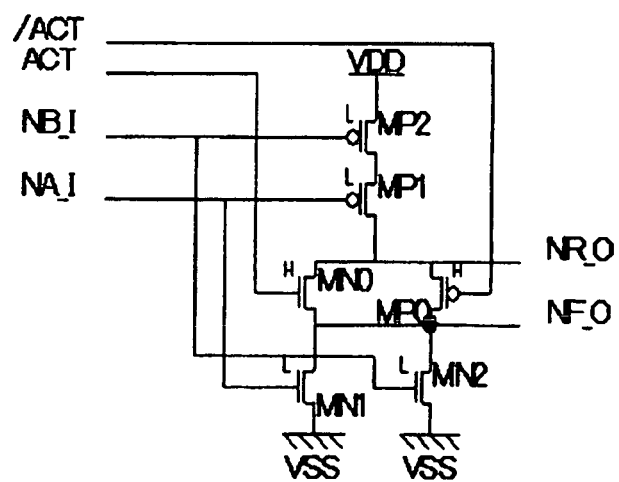

FIG.13
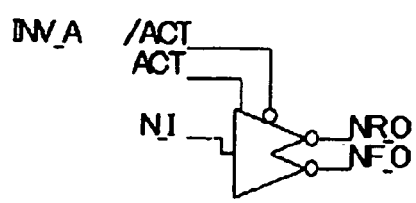
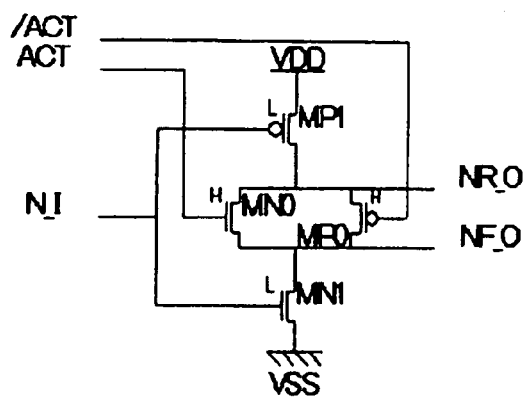
FIG.14
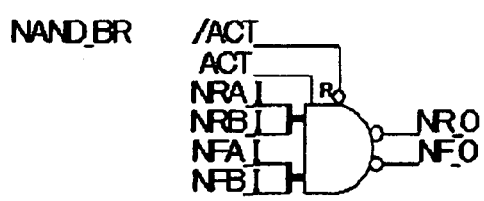
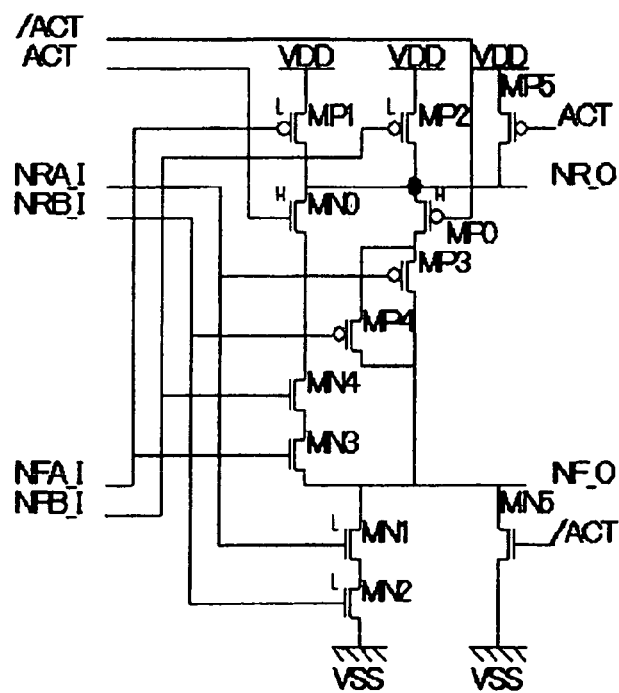

FIG. 15 NOR_BR
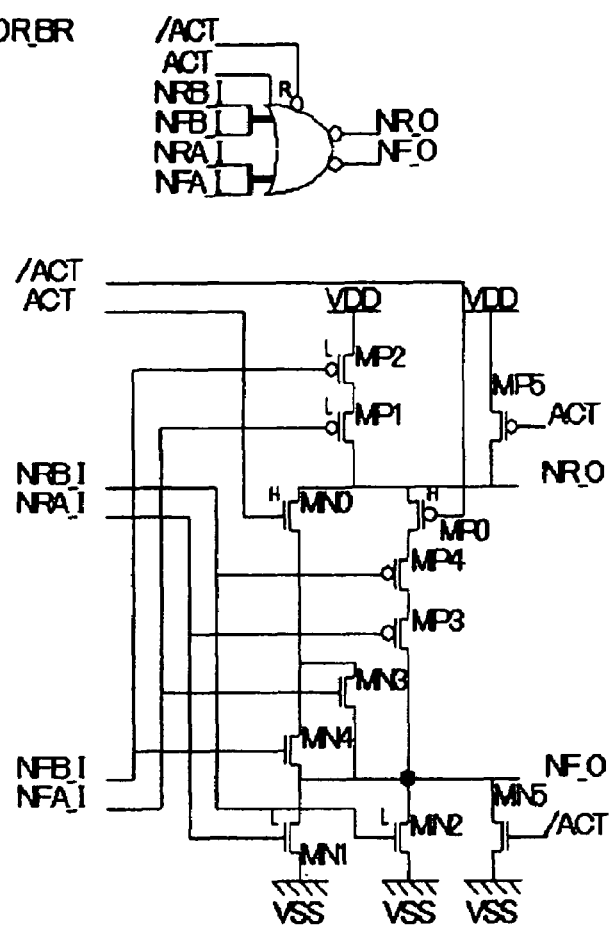
FIG. 16 INV_BR
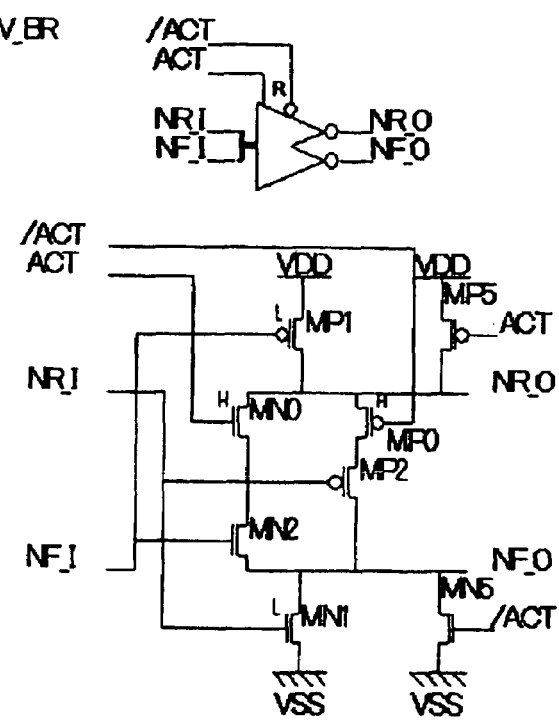

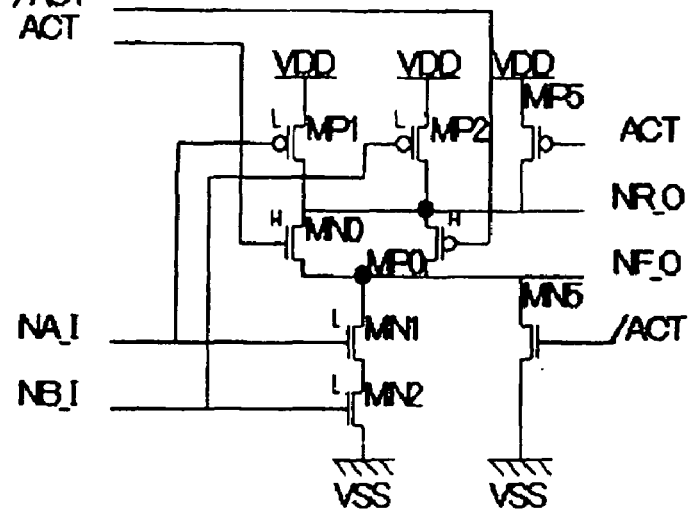

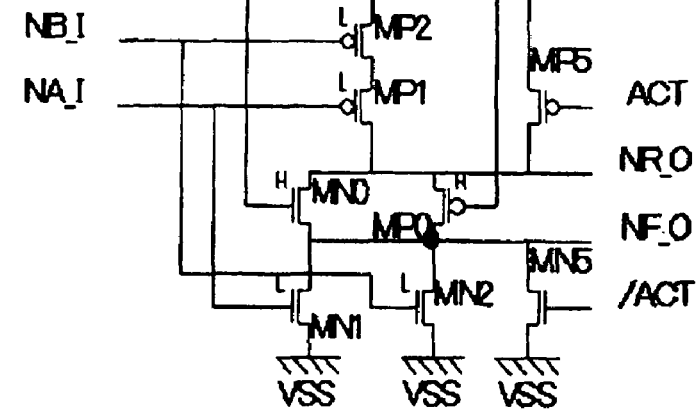

FIG.19
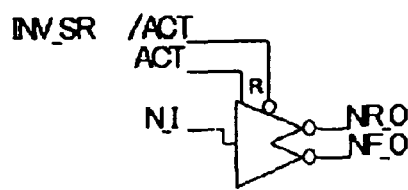
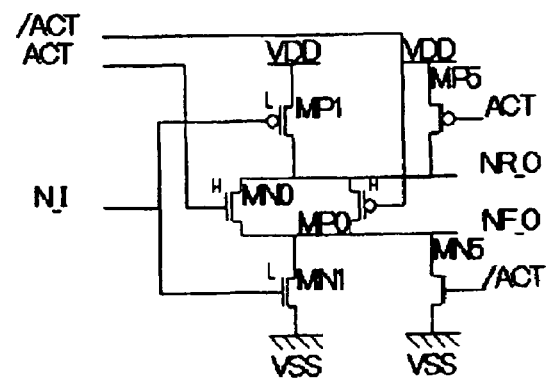
FIG.20
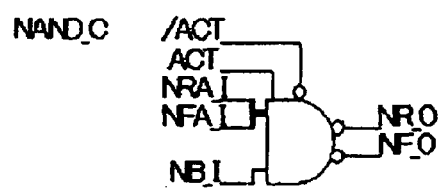
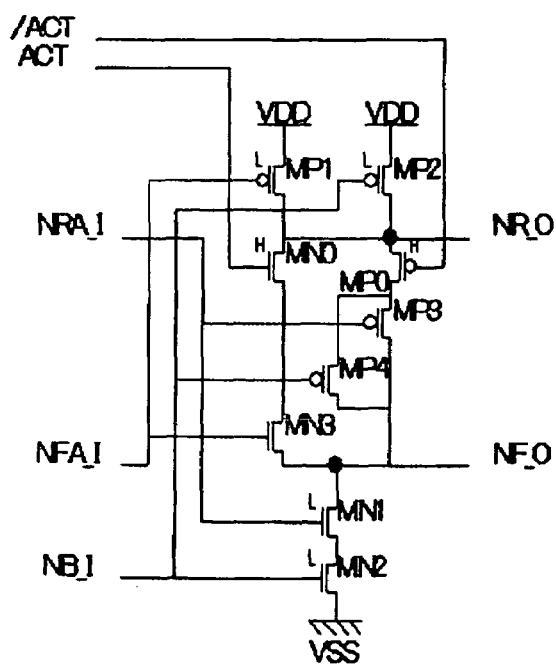

FIG.21
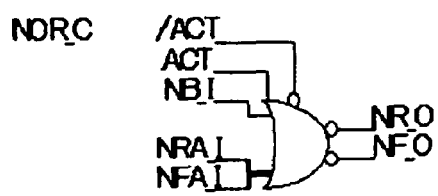
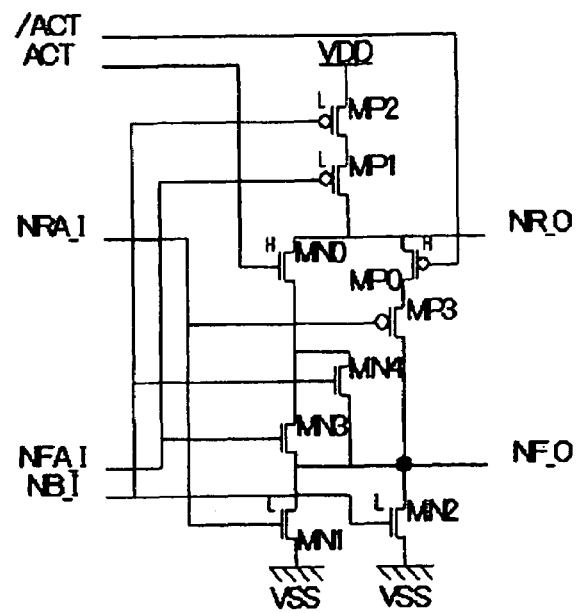
FIG.22
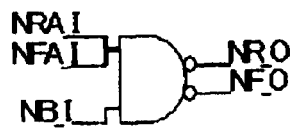
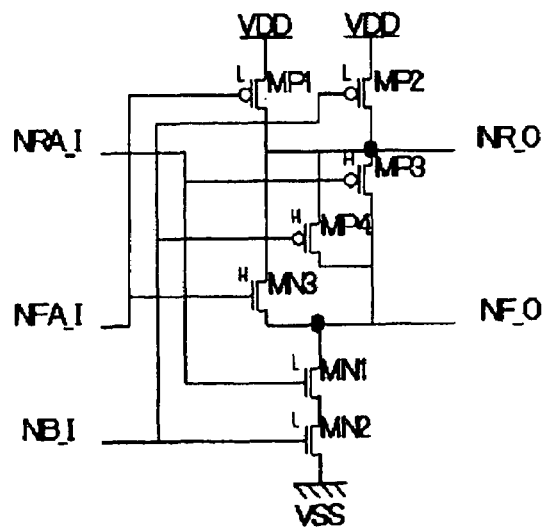

FIG.23    NOR_CS    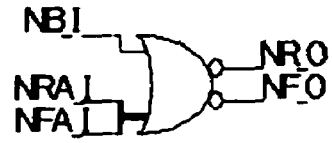
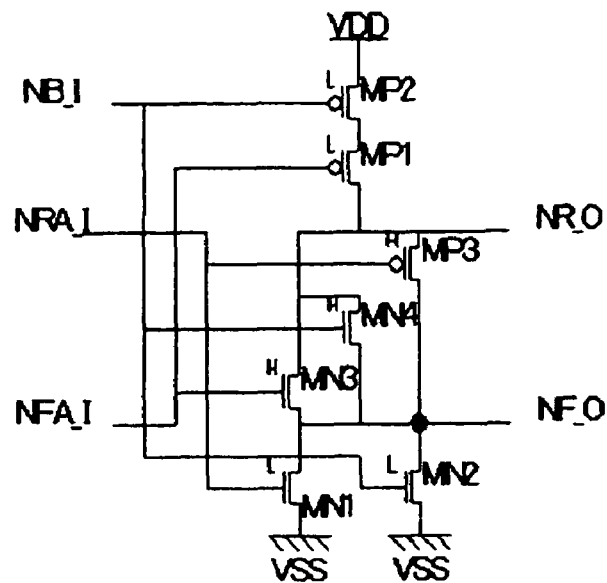
FIG.24    NAND_CSR    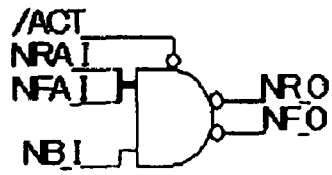
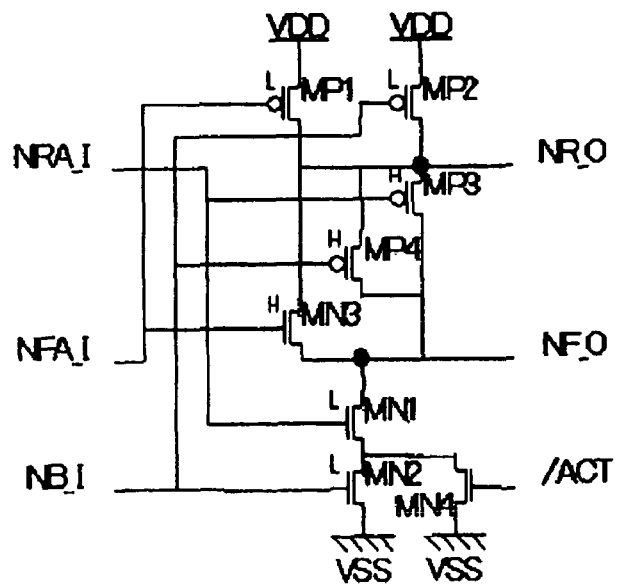

FIG.25
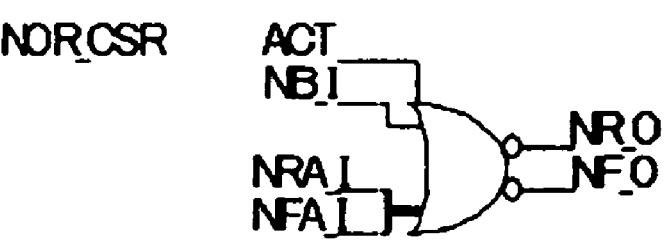
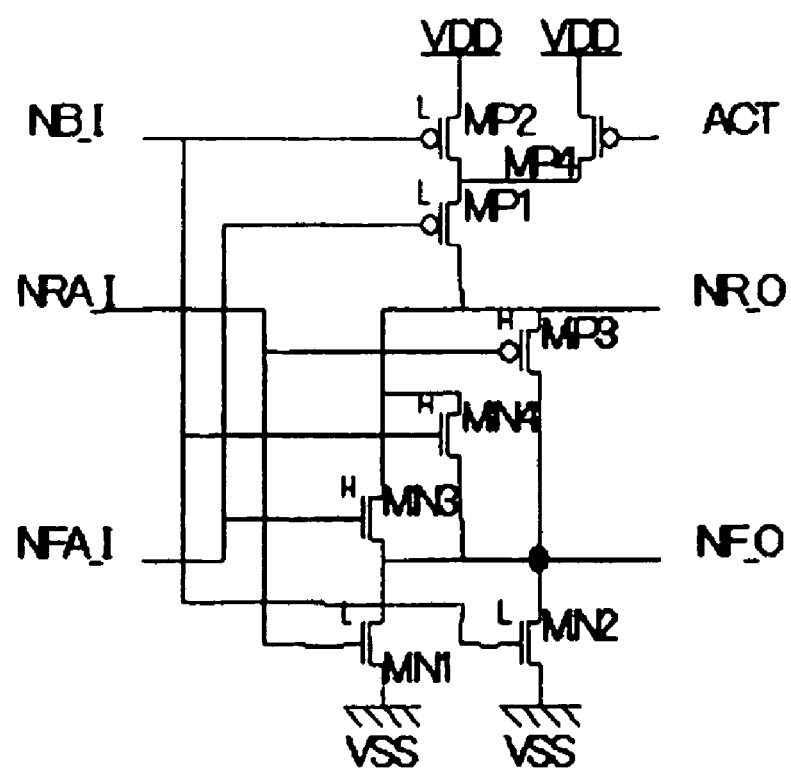

FIG.31
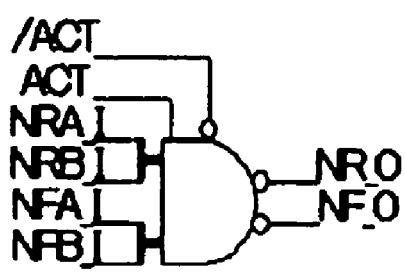
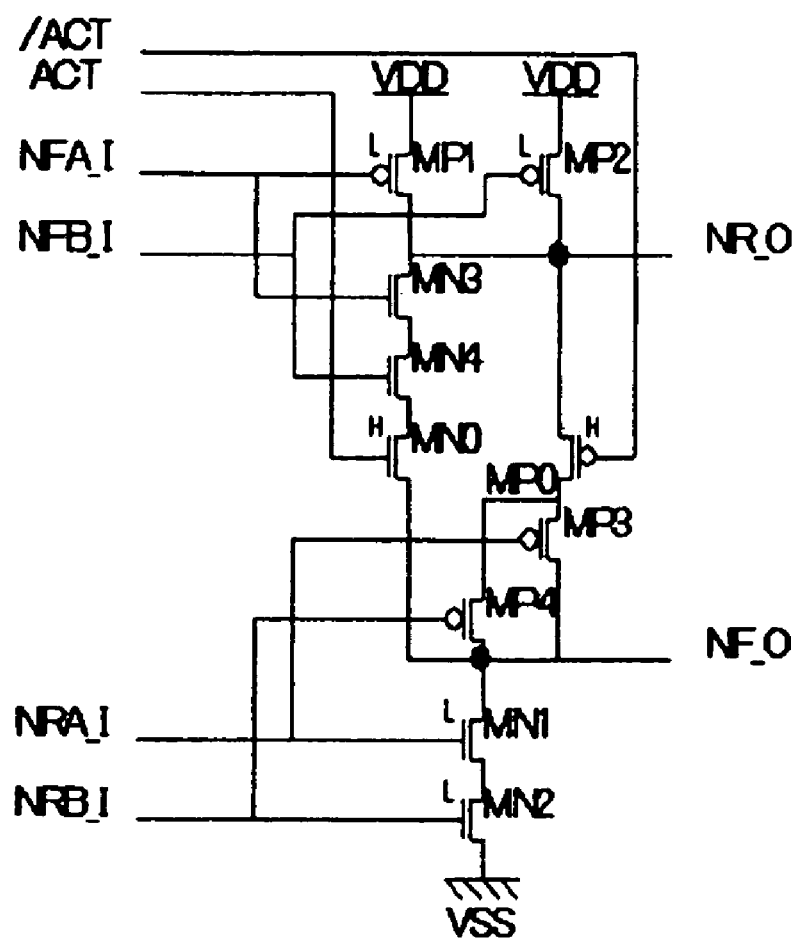

FIG.32 NOR_B 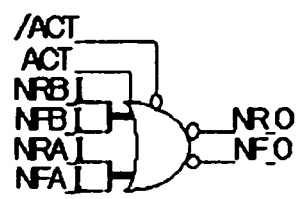
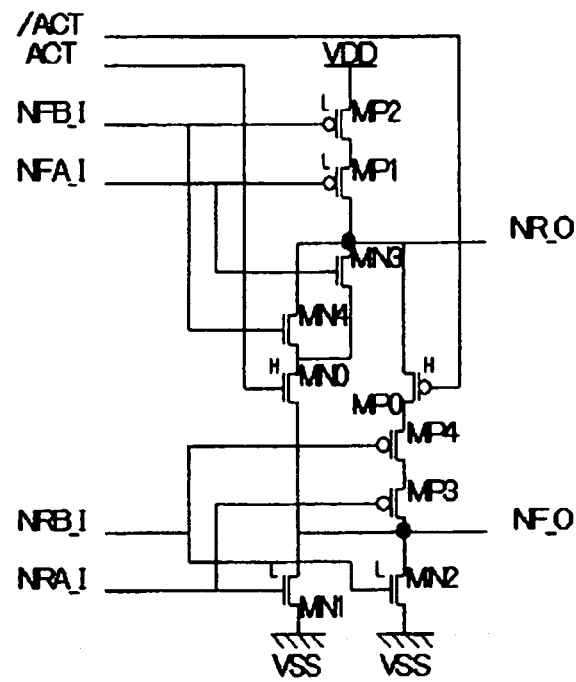
FIG.33 INV_B 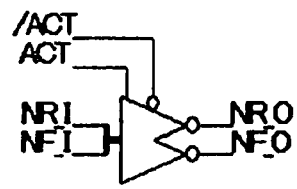
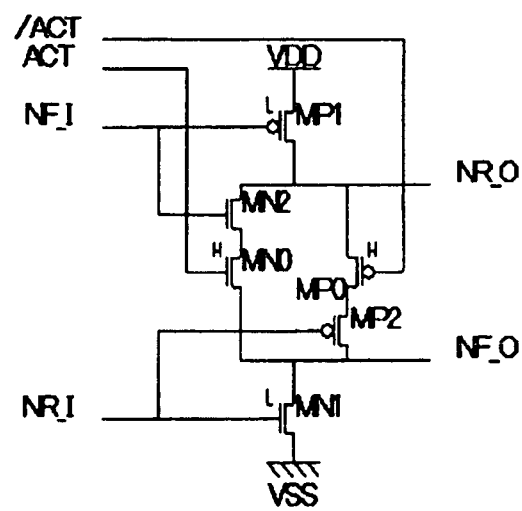

LOGIC GATE WITH REDUCED SUB-THRESHOLD LEAK CURRENT

BACKGROUND OF THE INVENTION

1. Field of the Invention

The present invention relates to a logic gate and logic circuit that use transistors of semiconductor elements.

2. Description of the Related Art

The higher integration of semiconductors in recent years has been accompanied by the problem of increase in current consumption. There is currently a trend toward decreasing the power supply voltage to reduce the current consumption. However, the performance of transistors does not necessarily keep pace with reductions in the power-supply voltage. Specifically, reducing the power-supply voltage necessitates the reduction of the threshold voltage of the transistors, but the threshold voltage cannot keep up with the reduction in power-supply voltage, and as a result, a reduction of the power-supply voltage brings with it a drop in transistor performance. Various designs are now being used to simultaneously realize a reduction of current consumption and higher speed.

The use of transistors having lower-than-normal threshold voltages to attain higher speeds raises the problem of increase in the OFF current (sub-threshold leak current) of transistors. This sub-threshold leak current is a current that consumes energy even when the circuit is not active (during standby), and this current must be reduced to zero in devices such as DRAM. As a result, transistors having an excessively low threshold voltage cannot be used, and the attainment of high speeds at low voltage becomes problematic.

Methods have been proposed for employing various circuit schemes to constructively use these low-threshold transistors and achieve high-speed circuit operation at low voltage. One such method is disclosed by Sakurai Takayasu in "Low Power Design of Digital Circuits" (International Symposium on Key Technologies for Future VLSI Systems, January 2001, pp. 1-5) and JP-A-2001-143477 (hereinbelow referred to as Patent Document 1).

FIGS. 1A and 1B show an example of a circuit of the prior art that uses low-threshold transistors. In the circuit shown in FIG. 1A, a low-Vt CMOS logic unit is formed with a low threshold voltage for the purpose of reducing the sub-threshold leak current and achieving high-speed operation at low voltage. A PMOS transistor (MP7) is interposed between the power-supply voltage VDD and virtual VDD that is the actual power supply of the low-Vt CMOS logic unit. In addition, an NMOS transistor (MN7) is interposed between power-supply voltage VSS and the virtual VSS that is the actual power supply of the low-Vt CMOS logic unit. These transistors turn ON during active intervals and are thus connected to VDD/VSS and turn OFF during cut-off (standby) intervals. Even when low-Vt CMOS logic unit is made up by low-threshold voltage transistors, this cut-off operation cuts the sub-threshold leak current during standby intervals by isolating the low-Vt CMOS logic unit from VDD/VSS. As a result, a sub-threshold leak current is generated only during active intervals.

FIG. 1B shows a circuit realized by means of another example of the prior art. The symbol "H" in the figure indicates high-threshold transistors, and the symbol "L" indicates low-threshold transistors. In the circuit shown in FIG. 1B, when the state of input is fixed and the input signal IN is "high" during standby, transistors that are OFF are configured with high threshold voltages. As a result, the transistors for cut-off (hereinbelow referred to as simply "cut-off transistors") are no longer needed. However, when the input signal IN is "low," the cut-off transistors become necessary.

The following two cases can be considered as the configuration of the cut-off transistors. In one case, the cut-off transistors are made up by high-threshold transistors that have a sufficiently small sub-threshold leak current. In the other case, the cut-off transistors are made up by low-threshold transistors and a negative voltage is applied to the gate voltage. In either case, operating the low-Vt CMOS logic unit at high speed necessitates an adequate increase of capabilities. Adopting a gate size that is three times the normal total block gate length retards the speed of the block unit by approximately 10%.

However, the cut-off circuit for decreasing the sub-threshold leak current that is disclosed in Patent Document 1 has the problems described hereinbelow.

As the first problem, when the low-Vt CMOS logic unit is operating, turning ON/OFF the transistors interposed between the power supply VDD/VSS and the virtual VDD/VSS controls active/standby, whereby the power supply level of the virtual VDD/VSS drops depending on the capability of these transistors. The Vds is therefore degraded in proportion to this drop, and the speed is thus retarded (FIG. 2). In other words, the speed of the block is necessarily lowered, and the sufficient capability cannot be obtained despite the use of low-threshold transistors in the configuration.

Minimizing the loss of speed brought about by the drop in virtual power supply as a countermeasure for this problem necessitates an increase of the size of the cut-off transistors. As a second problem, increasing the size of the cut-off transistors increases the gate charge/discharge current of the cut-off transistors and thus increases the current consumption. The increase in the size of the cut-off transistors is further a cause for the enlargement of the chip size due to increase of the gate surface area. In addition, the cut-off operation causes the amount of charge in the low-Vt CMOS logic to be reset, and further, causes the output wiring to be reset, whereby the current consumption increases further, canceling any current-reduction effect as a result.

Recovery to the operating state from standby as described above necessitates the above-described charge/discharge of the wiring and the gates of the cut-off transistors. The third problem is the sheer size of the capacitance of the gates and wiring, resulting in an increase in the time required for charge/discharge. Not only is the charge/discharge current for the output signal wiring large, but more than several hundred ns are required to return from the cut-off state to a state that allows operation. The problem therefore arises that operation following recovery is consequently retarded.

SUMMARY OF THE INVENTION

It is an object of the present invention to provide a logic gate and a logic circuit that reduce sub-threshold leak current.

According to the present invention, a logic gate comprises a first transistor for receiving a first voltage at its source, receiving a first input signal at its gate, and supplying a first output signal from its drain; a second transistor for receiving at its source a second voltage that is lower than the first voltage, receiving a second input signal at its gate, and supplying a second output signal from its drain; and a connection-switching unit that is connected between the drains of the first transistor and the second transistor for connecting or cutting off the first transistor and the second transistor.

In the present invention, a first transistor that is connected to a high voltage and second transistor that is connected to a low voltage are connected by an interposed switch connector.

By means of this configuration, turning OFF the switch connector cuts the connection between the first transistor and the second transistor and suppresses the sub-threshold leak current that flows by way of the first transistor. Despite the use of a logic gate realized by a low-threshold transistor, high-speed operation is enabled due to the near-total elimination of the feedthrough current that flows to low voltage from the high voltage that is generated when switching between an operation interval and a standby interval. In addition, because switching of the connection is not realized between the low-threshold transistor and the voltage that is applied to this low-threshold transistor, the temporary drop of the voltage that is applied to the transistor when switching from a standby interval to an operation interval can be suppressed, thereby enabling high-speed operation of the logic gate.

The above and other objects, features and advantages of the present invention will become apparent from the following description with reference to the accompanying drawings which illustrate examples of the present invention.

BRIEF DESCRIPTION OF THE DRAWINGS

FIG. 4 is a circuit diagram showing an example of the configuration of cut-off logic in the first embodiment;

FIG. 5 is a circuit diagram showing an example of the configuration of a NAND circuit of the cut-off logic in the first embodiment;

FIG. 6 is a circuit diagram showing an example of the configuration of a NOR circuit of the cut-off logic in the first embodiment;

FIG. 7 is a circuit diagram showing an example of the configuration of an inverter circuit of the cut-off logic in the first embodiment;

FIG. 8 is a circuit diagram showing an example of the configuration of a NAND circuit that lacks ACT cut-off of the cut-off logic in the first embodiment;

FIG. 9 is a circuit diagram showing an example of the configuration of a NOR circuit that lacks ACT cut-off of the cut-off logic in the first embodiment;

FIG. 10 is a circuit diagram showing an example of the configuration of an inverter circuit that lacks ACT cut-off of the cut-off logic in the first embodiment;

FIG. 11 is a circuit diagram showing an example of the configuration of a NAND circuit that lacks high-speed/low-speed transitions in the input signal of the cut-off logic in the first embodiment;

FIG. 12 is a circuit diagram showing an example of the configuration of a NOR circuit that lacks high-speed/low-speed transitions in the input signal of the cut-off logic in the first embodiment;

FIG. 13 is a circuit diagram showing an example of the configuration of an inverter circuit that lacks high-speed/low-speed transitions in the input signal of the cut-off logic in the first embodiment;

FIG. 14 is a circuit diagram showing an example of the configuration of a NAND circuit having output resetting by ACT of the cut-off logic in the first embodiment;

FIG. 15 is a circuit diagram showing an example of the configuration of a NOR circuit having output resetting by ACT of the cut-off logic in the first embodiment;

FIG. 16 is a circuit diagram showing an example of the configuration of an inverter circuit having output resetting by ACT of the cut-off logic in the first embodiment;

FIG. 19 is a circuit diagram showing an example of the configuration of an inverter circuit having output resetting by means of ACT and lacking high-speed/low-speed transitions in the input signal of cut-off logic in the first embodiment;

FIG. 20 is a circuit diagram showing an example of the configuration of a NAND circuit having high-speed/low-speed transitions in the input of only one side of cut-off logic in the first embodiment;

FIG. 21 is a circuit diagram showing an example of the configuration of a NOR circuit having high-speed/low-speed transitions in the input of only one side of cut-off logic in the first embodiment;

FIG. 22 is a circuit diagram showing an example of the configuration of a NAND circuit lacking ACT cut-off but having high-speed/low-speed transitions in the input of only one side of cut-off logic in the first embodiment;

FIG. 23 is a circuit diagram showing an example of the configuration of a NOR circuit lacking ACT cut-off but having high-speed/low-speed transitions in the input of only one side of cut-off logic in the first embodiment;

FIG. 24 is a circuit diagram showing an example of the configuration of a NAND circuit having output resetting by means of ACT, lacking ACT cut-off, and having high-speed/low-speed transitions in the input of only one side of cut-off logic in the first embodiment;

FIG. 25 is a circuit diagram showing an example of the configuration of a NOR circuit having output resetting by means of ACT, lacking ACT cut-off, and having high-speed/low-speed transitions in the input of only one side of cut-off logic in the first embodiment;

FIG. 31 is a circuit diagram showing an example of the configuration of a NAND circuit of the cut-off logic in the second embodiment;

FIG. 32 is a circuit diagram showing an example of the configuration of a NOR circuit of cut-off logic in the second embodiment;

FIG. 33 is a circuit diagram showing an example of the configuration of an inverter circuit of cut-off logic in the second embodiment;

DETAILED DESCRIPTION OF THE PREFERRED EMBODIMENTS

First Embodiment

Explanation next regards the logic gate and logic circuit of the present embodiment.

Figure 3:
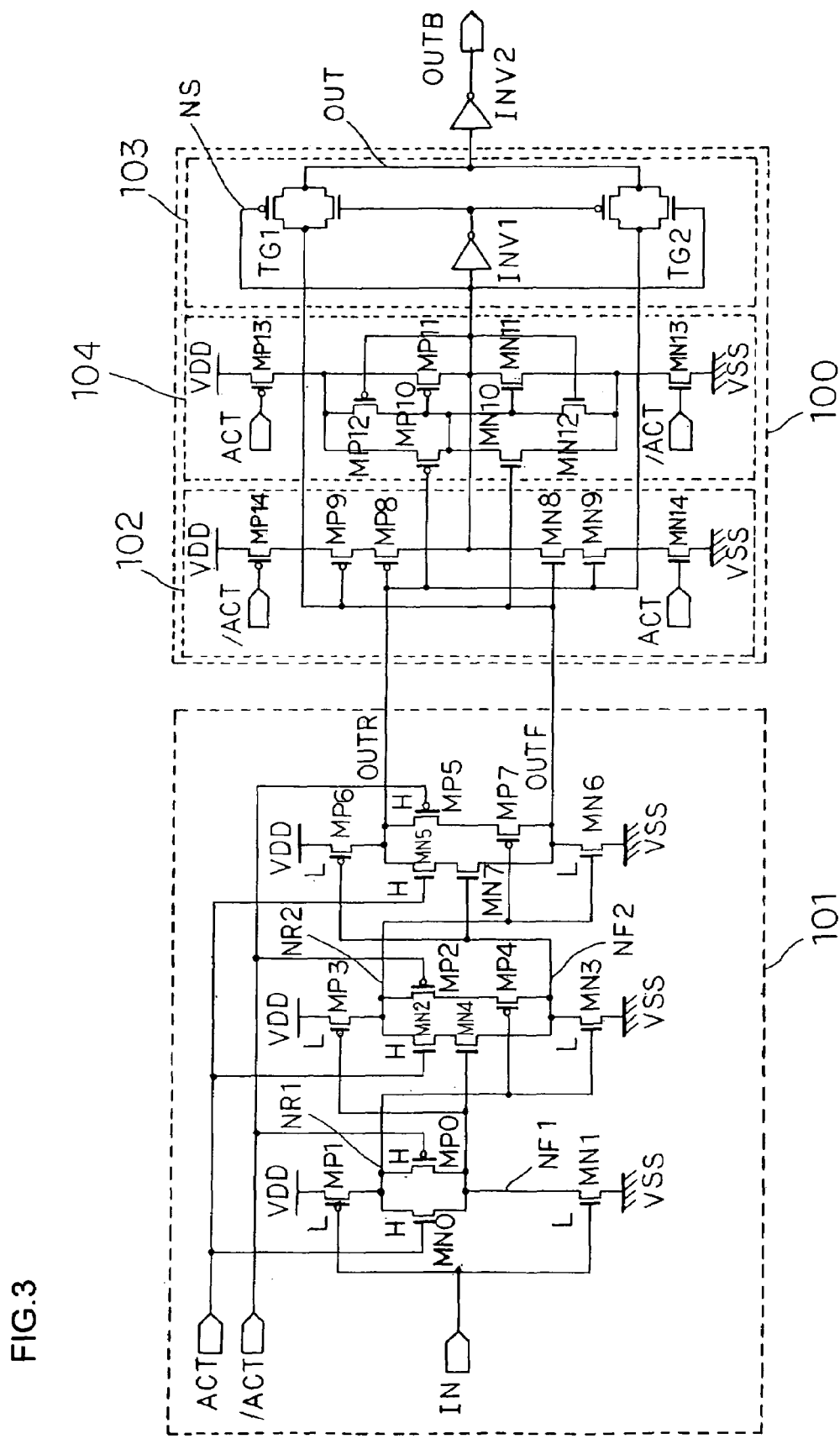
FIG. 3 is a block diagram showing an example of the configuration of a logic circuit in the first embodiment.

FIG. 3 shows the overall configuration of the cut-off circuit according to the present embodiment. The cut-off circuit is of a configuration that includes: cut-off logic circuit 101, and high-speed transition receiver and cut-off time data holding circuit (hereinbelow referred to as "high-speed transition detection/holding circuit") 100 for receiving a signal from cut-off logic circuit 101 and delivering the result of this signal.

Explanation next regards the basic configuration of the logic gates that are used in cut-off logic circuit 101. In FIG. 3, three stages of logic gates are provided in cut-off logic circuit 101.

FIG. 4 is a circuit diagram showing an example of the configuration of the logic gates in the present embodiment. The logic gate shown in FIG. 4 is an inverter.

The inverter shown in FIG. 4 is of a configuration that includes: PMOS transistor MP1 having its source connected to the power-supply VDD; NMOS transistor MN1 having its source connected to power supply VSS; NMOS transistors MN0 and MN2 that are connected in a series between the drain of PMOS transistor MP1 and the drain of NMOS transistor MN1; and PMOS transistors MP0 and MP2 that are connected in a series between the drain of PMOS transistor MP1 and the drain of NMOS transistor MN1. In addition, the code "MN" indicates an NMOS transistor while "MP" indicates a PMOS transistor. In the following explanation, transistors will be referred to as simply "transistors" and the identification as a P-type or N-type will be omitted.

Signal NF-I is applied as input to the gates of transistor MP1 and transistor MN2, and signal NR-I is applied as input to the gates of transistor MP2 and transistor MN1. Signal NR-O is delivered as output from the drain of transistor MP1, and signal NF-O is delivered as output from the drain of transistor MN1.

Each of control signals ACT and /ACT for controlling whether the inverter is placed in operation (active) or held in standby are applied as input to the gates of transistor MN0 and transistor MP0, respectively. When the inverter is placed in operation, the level of control signal ACT is "high" and the level of control signal /ACT is "low." On the other hand, when the inverter is placed in standby, control signal ACT is "low" and control signal /ACT is "high." By the input of these control signals, transistor MN0 and transistor MP0 are turned ON during operation and turned OFF during standby.

The following measure is carried out to cut off the sub-threshold leak current in the inverter shown in FIG. 4. The "H" that appears close to the gate terminals of transistors in the figure indicates transistors that have a high threshold voltage and that are completely OFF when Vgs=0V. The "L" that appears close to the gate terminals indicates transistors that have low threshold voltages and in which a sub-threshold current flows even when Vgs=0 v and that therefore cannot turn completely OFF. Transistors that lack both "H" and "L" close to the gate terminal may be of either type without causing any problem. As shown in FIG. 4, transistor MP1 and transistor MN1 are low-threshold transistors, and transistor MP0 and transistor MN0 are high-threshold transistors. In addition, transistor MP2 and transistor MN2 are transistors that may have either a high threshold or a low threshold.

High-threshold transistors MP0 and MN0 are connection-switching units for cutting off the connection between low-threshold transistor MP1 and low-threshold transistor MN1 during standby of the inverter shown in FIG. 4 and for connecting low-threshold transistor MP1 and low-threshold transistor MN1 when active. By the above-described switching, a greater reduction of the sub-threshold leak current than in the prior art is achieved when the inverter is in standby, and the logic gate operates at low voltage when active.

Explanation next regards the operation of the logic gate shown in FIG. 4.

Input signal NR-I is a rise-side high-speed transition signal, and NF-I is a fall-side high-speed transition signal. Low-threshold transistor MN1 receives input signal NR-1 at its gate, is connected to power supply VSS at its source, and supplies output signal NF-O as output from its drain. Low-threshold transistor MP1 receives input signal NF-I as input at its gate, is connected to power supply VDD at its source, and supplies output signal NR-O as output from its drain. High-threshold transistors MN0 and MP0 for cutting off the sub-threshold leak current during standby are connected in parallel between the wiring by which output signal NR-O is supplied and the wiring by which output signal NF-O is supplied. Transistor MP2 is connected in a series to high-threshold transistor NP0, and input signal NR-I is supplied as input to the gate of transistor MP2. Transistor MN2 is connected in a series to high-threshold transistor MN0, and input signal NF-I is applied as input to the gate of transistor MN0.

Input signal NR-I transitions rapidly from "low" to "high," and transitions slowly from "high" to "low." Input signal NF-I transitions rapidly from "high" to "low," and transitions slowly from "low" to "high." For example, when input signal NR-I transitions rapidly from "low" to "high," input signal NF-I is "low," and transistor MN2 is therefore OFF. Transistor MP2 turns OFF at the same time that low-threshold transistor MN1 turns ON. High-threshold transistors MN0 and MP0 are constituted by transistors having high threshold voltages and low capacity, and are consequently of a configuration in which the VDD-side power supply is difficult to discern from the node output signal NF-O. In other words, when input signal NR-I transitions from "low" to "high," output signal NF-O rapidly transitions from "high" to "low." When input signal NF-I subsequently transitions from "low" to "high," low-threshold transistor MP1 turns OFF and transistor MN2 turns ON. As a result, output signal NR-O transitions at low speed from "high" to "low" by way of high-threshold transistors MN0 and MP0 that assume high resistance.

The output load of input signal NR-I becomes the gate capacitance load of low-threshold transistors MN1 and MP2 and the wiring portion, but as described hereinabove, the gate size of transistor MP2 is set smaller than the PMOS size of a normal inverter configuration, and the gate capacitance is therefore lower. In other words, high-speed operation is possible because the load of the signal is light.

In cut-off logic circuit 101, three stages of inverters are provided, and the inverter shown in FIG. 4 is provided in two stages: the middle and last stages. The inverter that is an example of the other circuit of the present embodiment is provided in the initial input stage. The configuration of this inverter will be explained hereinbelow. Cut-off logic circuit 101 supplies as output two signals from the above-described inverters: a high-speed transition signal and a low-speed transition signal.

Explanation next regards the configuration of high-speed transition detection/holding circuit 100 that is shown in FIG. 3.

As previously described, two signals are supplied as output from cut-off logic circuit 101: a high-speed transition signal and a low-speed transition signal, and these signals must be arranged as one signal for output to the outside of the circuit. The circuit for arranging the signals is high-speed transition detection/holding circuit 100 shown in FIG. 3. High-speed transition detection/holding circuit 100 is of a configuration that includes high-speed transition detection (receiver) unit 102 for receiving the above-described two signals, high-speed transition output unit 103 for delivering the rearranged single signal to the outside, and cut-off time data holding unit 104 for temporarily holding data. Explanation next regards the configuration of each part.

In high-speed transition detection unit 102, transistors MP14, MP9, MP8, MN8, MN9, and MN14 are connected in a series between power supply VDD and power supply VSS and in that order from the power supply VDD side to the power supply VSS side. Signal OUTR from cut-off logic circuit 101 is applied as input to the gates of transistor MP8 and transistor MN9. Signal OUTF from cut-off logic circuit 101 is applied as input to the gates of transistor MP9 and transistor MN8. Control signal /ACT is applied to the gate of transistor MP14, and control signal ACT is applied to the gate of transistor MN14.

In cut-off time data holding unit 104, transistors MP13, MP11, MN11, and MN13 are connected in a series in that order between power supply VDD and power supply VSS. In addition, transistor MP12 and transistor MN12 are connected in a series in that order between the drain of transistor MP13 and the drain of transistor MN13. Transistor MP10 and transistor MN10 are connected in a series in that order between the drains of transistor MP13 and transistor MN13. Signal OUTR is applied as input to the gate of transistor MP10, and signal OUTF is applied as input to the gate of transistor MN10. The potential of the drains of transistors MP10 and MN10 is applied as input to the gates of transistors MP11 and MN11. The potential of the drains of transistors MP11 and MN11 is applied as input to the gates of transistors MP12 and MN12. The potential of the drains of transistors MP11 and MN11 is the NS signal and is sent to high-speed transition output unit 103. Control signal ACT is applied as input to the gate of transistor MP13, and control signal /ACT is applied as input to the gate of transistor MN13.

High-speed transition output unit 103 includes: transfer gates TG1 and TG2 that are the switching gates for supplying signal OUTR or OUTF; and inverter INV1 for inverting signal NS and supplying the inverted signal to transfer gates TG1 and TG2. High-speed transition output unit 103 turns ON transfer gate TG2 when signal NS is "high," and supplies signal OUTR to the outside as signal OUT. High-speed transition output unit 103 further turns transfer gate TG1 ON when signal NS is "low" and sends signal OUTF to the outside as signal OUT.

A brief explanation of the operation of high-speed transition detection/holding circuit 100 is next presented.

When input signals OUTR/F applied as input to high-speed transition detection unit 102 are both "low," high-speed transition output unit 103 supplies "low" to output signal OUT. When output signal OUTR transitions from "low" to "high," high-speed transition output unit 103 causes output signal OUT to rapidly transition from "low" to "high." Transfer gates TG1 and TG2 of high-speed transition output unit 103 are controlled by output signal NS from high-speed transition detection unit 102, and control is implemented such that TG2 in turned ON and TG1 is turned OFF when input signal OUTR transitions from "low" to "high." When rise-time low-speed transition side signal OUTF transitions from "low" to "high," transfer gates TG1 and TG2 are switched and prepare for the reception of a signal to switch input signal OUTF from "high" to "low."

Cut-off time data holding unit 104 holds output data during standby (cut-off). Details of the operation of cut-off time data holding unit 104 will be explained later, but a simple explanation is presented here. At the time of cut-off, control signal ACT becomes "low" (/ACT becomes "high"), and the output signal OUTR of cut-off logic circuit 101 gradually transitions to "high" and the output signal OUTF gradually transitions to "low" regardless of the input level IN. In other words, cut-off transistors MN5 and MP5 are turned OFF completely and transistors MN6 and MP6 allow a sub-threshold leak current to continue to flow, whereby output signal OUTR transitions to the power supply level. In the resulting state in which this output signal OUTR becomes "high" and output signal OUTF becomes "low," the final output signal OUT becomes uncertain. However, cut-off time data holding unit 104 holds the state of output data of output signal OUT before ACT becomes "low" and thus stabilizes output signal OUT.

Explanation next regards the eight types of logic gates from Type A to Type H that are used in cut-off logic circuit 101 of the present embodiment with reference to FIGS. 5 to 25. In the following explanation, each of the logic gates of the NAND, NOR, and inverters of the present embodiment are referred to as cut-off NAND, cut-off NOR, and cut-off inverters, respectively. These logic gates are collectively referred to as "cut-off logic."

The meanings of the signals shown in FIG. 5 and subsequent figures are as described below. NR-I is a rise-side high-speed transition input signal that is applied as input to an inverter, and NF-I is a fall-side high-speed transition input signal that is applied as input to an inverter. NRA-I, NFA-I, NRB-I, and NFB-I are four signals that are applied as input to NAND or NOR. NRA-I and NFA-I are output signals from the cut-off logic of one preceding stage, and NRB-I and NFB-I are output signals from the cut-off logic of the other preceding stage. The input signals of NAND and NOR are NA-I and NB-I because the preceding stage is not cut-off logic. In other words, the input signals in this case are not an access path and either indicate input signals from logic that is composed of high-threshold transistors without using cut-off logic circuits, or indicate signals in which the output from cut-off logic circuits is combined into one signal in high-speed transition detection unit 102. The output signals become NR-O and NF-O in all logic. As described above, NR-O is a rise-side high-speed transition output signal, and NF-O is a fall-side high-speed transition output signal. In addition, control is implemented by "ACT" and "/ACT" as cut-off control signals. During normal operation (when active), control signal ACT is "high," and control signal /ACT is "low." During cut-off (during standby), ACT is "low" and /ACT is "high." In addition, a logic gate symbol is shown above the circuit configuration figure of each logic gate.

The configuration of Type A cut-off logic is shown in FIGS. 5 to 7.

FIG. 5 is a circuit diagram showing an example of the configuration of a cut-off NAND.

The cut-off NAND shown in FIG. 5 includes: low-threshold transistors MP1 and MP2 having sources connected to power supply VDD; low-threshold transistor MN2 having its source connected to power supply VSS; low-threshold transistor MN1 having its source connected to the drain of low-threshold transistor MN2; and a connection-switching unit that is connected between the drains of low-threshold transistors MP1 and MP2 and the drain of low-threshold transistor MN1. In the connection-switching unit, high-threshold transistor MN0 and transistors MN4 and MN3 are connected in a series and in that order from the drains of low-threshold transistors MP1 and MP2 to the drain of low-threshold transistor MN1. In addition, high-threshold transistor MP0 and transistor MP3 are connected in a series in that order from the drains of low-threshold transistors MP1 and MP2 to the drain of low-threshold transistor MN1. Finally, transistor MP4 is connected in parallel to transistor MP3.

Signal NFA-I is applied as input to the gates of low-threshold transistor MP1 and transistor MN3, and signal NFB-I is applied as input to the gates of low-threshold transistor MP2 and transistor MN4. Signal NRA-I is applied as input to the gates of low-threshold transistor MN1 and transistor MP3, and signal NRB-I is applied as input to the gates of low-threshold transistor MN2 and transistor MP4. Control signal ACT is applied as input to the gate of high-threshold transistor MN0, and control signal /ACT is applied as input to the gate of high-threshold transistor MP0. The potential of the drains of low-threshold transistors MP1 and MP2 is output signal NR-O, and the potential of the drain of low-threshold transistor MN1 is output signal NF-O.

Explanation next regards the operation of the cut-off NAND shown in FIG. 5.

The NAND shown in FIG. 5 sets high-speed transition output signal NF-O to "low" when both of rise-side high-speed transition input signals NRA-1 and NRB-I transition to "high." The NAND further causes high-speed transition output signal NOR-O to transition to "high" when either of fall-side high-speed transition input signals NFA-I and NFB-I transitions to "low." Transistors MN3, MN4, MP3, and MP4 are connected between the signal lines of NF-O and NR-0, and operate such that the interconnection between signal lines NF-O and NR-0 is OFF when the gates of low-threshold transistors MN1 and MN2 are "high," or when the gate of low-threshold transistor MP1 or MP2 is "low." In other words, transistors MN3, MN4, MP3, and MP4 are connected so as to turn transistors MP3 and MP4 OFF when low-threshold transistors MN1 and MN2 are ON; and to turn the corresponding transistor MN3 or MN4 OFF when low-threshold transistor MP1 or MP2 is ON. Further, high-threshold transistors MP0 and MN0 cut off the sub-threshold leak current by turning ON during operation and turning OFF during cut-off, as explained regarding the inverter of FIG. 4.

FIG. 6 is circuit diagram showing an example of the configuration of a cut-off NOR.

The cut-off NOR shown in FIG. 6 includes: low-threshold transistor MP2 having its source connected to power supply VDD; low-threshold transistor MP1 having its source connected to the drain of low-threshold transistor MP2; two low-threshold transistors MN1 and MN2 having sources connected to power supply VSS; and a connection-switching unit connected between the drains of low-threshold transistor MP1 and low-threshold transistors MN1 and MN2. In the connection-switching unit, high-threshold transistor MP0 and transistors MP4 and MP3 are connected in a series in that order from the drain of low-threshold transistor MP1 to the drains of low-threshold transistors MN1 and MN2. In addition, high-threshold transistor MN0 and transistor MN4 are connected in a series in that order from the drain of low-threshold transistor MP1 to the drains of low-threshold transistors MN1 and MN2. Transistor MN3 is then connected in parallel to transistor MN4.

The signals that are applied as input to the gate of each transistor are similar to those of the cut-off NAND described in FIG. 5. The potential of the drain of low-threshold transistor MP1 is output signal NR-O, and the potential of the drains of low-threshold transistors MN1 and MN2 is output signal NF-O.

Explanation next regards the operation of cut-off NOR shown in FIG. 6.

The cut-off NOR shown in FIG. 6 sets high-speed transition output signal NF-O to "low" when either of rise-side high-speed transition input signals NRA-I and NRB-I transition to "high," as with the cut-off NAND shown in FIG. 5. The cut-off NOR further causes high-speed transition output signal NR-O to transition to "high" when both of fall-side high-speed transition input signals NFA-I and NFB-I transition to "low." In cut-off NOR, power supply VSS is applied to the sources of each of low-threshold transistors MN1 and MN2, fall-side high-speed transition output signal NF-O is supplied as output from the drains, and rise-side high-speed transition input signals NRA-I and NRB-I are applied as input to the gates of transistors MN1 and MN2, respectively. In addition, power supply VDD is applied to the source of low-threshold transistor MP2, and the drain of transistor MP2 is the same potential as the source of low-threshold transistor MP1. Rise-side high-speed transition output signal NR-O is supplied as output from the drain of low-threshold transistor MP1. Fall-side high-speed transition input signals NFA-I and NFB-I are applied as input to the gates of low-threshold transistors MP1 and MP2. Transistors MN3, MN4, MP3, and MP4 are connected between the signal lines of NF-O and NR-O and thus operate such that the connection between the signal lines of NF-O and NR-O is OFF when the gate of low-threshold transistor MN1 or MN2 is "high," or when the gates of low-threshold transistors MP1 and MP2 are "low."In other words, transistors MN3, MN4, MP3 and MP4 are connected such that when low-threshold transistor MN1 or MN2 is ON, transistor MP3 or MP4 turns OFF in correspondence, and such that transistors MN3 and MN4 turn OFF when low-threshold transistors MP1 and MP2 turn ON. The operation of high-threshold transistors MN0 and MP0 is equivalent to that of the cut-off NAND that was shown in FIG. 5.

FIG. 7 is a circuit diagram showing an example of the configuration of a cut-off inverter. The cut-off inverter shown in FIG. 7 is the same as the circuit shown in FIG. 4, and the details regarding the configuration and operation, having been already described in the explanation of FIG. 4, will be omitted here.

Explanation next regards Type B cut-off logic. FIGS. 8 to 10 show the configuration of Type B cut-off logic.

Type B cut-off logic is characterized by the deletion of high-threshold transistors MN0 and MP0 from Type A cut-off logic, high-threshold transistors MN0 and MP0 being cut-off transistors, by means of control signals ACT and /ACT. A simple explanation of the configuration of each cut-off logic follows below.

The cut-off NAND shown in FIG. 8 is of a configuration in which high-threshold transistors MP0 and MN0 have been eliminated from the cut-off NAND shown in FIG. 5 and in which transistors MP3, MP4, MN3, and MN4 are employed as high-threshold transistors. Transistors MP3, MP4, MN3, and MN4 function as a connection-switching unit.

The cut-off NOR shown in FIG. 9 is of a configuration in which high-threshold transistors MP0 and MN0 have been eliminated from the cut-off NOR shown in FIG. 6 and in which transistors MP3, MP4, MN3, and MN4 are employed as high-threshold transistors. Transistors MP3, MP4, MN3, and MN4 are the connection-switching unit.

The cut-off inverter shown in FIG. 10 is of a configuration in which high-threshold transistors MP0 and MN0 have been eliminated from the cut-off inverter shown in FIG. 7 and in which transistors MP2 and MN2 are employed as high-threshold transistors. Transistors MP2 and MN2 are the connection-switching unit.

The configurations are otherwise the same as for Type A, and a detailed explanation is therefore here omitted. The operation is also similar to that of Type A, and only a simple explanation is presented regarding the operation of the cut-off inverter shown in FIG. 10 to represent Type B.

At the time of cut-off, the cut-off inverter shown in FIG. 10 pulls high-speed transition output signal NR-O to "high" and pulls the high-speed transition output signal NF-O to "low" by means of the sub-threshold leak current or a resetting signal, which is to be explained later. As a result, "high" is received as rise-side high-speed transition input signal NR-I in the input of the succeeding stage, and "low" is received as fall-side high-speed transition input signal NF-I. Accordingly, low-threshold transistors MN1 and MP1 turn ON, and high-threshold transistors MN2 and MP2 turn OFF. The employment of transistors MN2 and MP2 as high-threshold transistors prevents the occurrence of the sub-threshold leak current, whereby cut-off transistors realized by control signal ACT no longer need be provided.

Explanation next regards Type C cut-off logic. FIGS. 11 to 13 are figures showing the configuration of Type C cut-off logic.

Type C cut-off logic is characterized by application to cases in which no distinction is made between rise-side high-speed transition and fall-side high-speed transition in the input signals to Type A cut-off logic. A brief explanation of the configuration of each cut-off logic follows below.

FIG. 11 is a circuit diagram showing an example of the configuration of the cut-off NAND. The cut-off NAND shown in FIG. 11 is of a configuration that includes, as the connection-switching unit in the cut-off NAND shown in FIG. 5, high-threshold transistor MN0 and high-threshold transistor MP0 that is connected in parallel to high-threshold transistor MN0, these transistors being connected between the drains of low-threshold transistors MP1 and MP2 and low-threshold transistor MN1. Signal NA-I is applied as input to the gates of low-threshold transistor MP1 and low-threshold transistor MN1, and signal NB-I is applied as input to the gates of low-threshold transistor MP2 and low-threshold transistor MN2.

FIG. 12 is a circuit diagram showing an example of the configuration of cut-off NOR. The cut-off NOR shown in FIG. 12 is of a configuration that includes, as the connection-switching unit in the cut-off NOR shown in FIG. 6, high-threshold transistor MP0 and high-threshold transistor MN0 that is connected in parallel to high-threshold transistor MP0, these transistors being connected between the drains of low-threshold transistor MP1 and low-threshold transistors MN1 and MN2. The signals that are applied as input to the gates of each transistor are as in the cut-off NAND shown in FIG. 11.

FIG. 13 is a circuit diagram showing an example of the configuration of a cut-off inverter.

The cut-off inverter shown in FIG. 13 is of a configuration that includes: as the connection-switching unit in the cut-off inverter shown in FIG. 7, high-threshold transistor MP0 and high-threshold transistor MN0 connected in parallel to high-threshold transistor MP0, these transistors being connected between the drains of low-threshold transistor MP1 and low-threshold transistor MN1. Signal N-I is applied as input to the gates of low-threshold transistors MP1 and MN1.

The operation of Type C cut-off logic is the same as that of Type A, and detailed explanation of the operation is therefore here omitted.

As shown in FIG. 3, Type C cut-off logic can be applied to the initial logic stage of, for example, cut-off logic circuit 101, and logic for receiving a signal that transitions rapidly together with both rise and fall, this being the combined signal of a rise-side high-speed transition signal and a fall-side high-speed transition signal.

Explanation next regards Type D cut-off logic. FIGS. 14 and 16 show the configuration of Type D cut-off logic.

Type D cut-off logic is logic in which logic that is forcibly pulled to power supplies VSS and VDD, respectively, when high-speed transition output signals NF-O and NR-O are cut-off in the configuration shown in Type A. A brief explanation regarding each cut-off logic follows below.

FIG. 14 is a circuit diagram showing an example of the configuration of a cut-off NAND. The cut-off NAND shown in FIG. 14 is of a configuration that includes, in the cut-off NAND shown in FIG. 5: transistor MP5 having its source connected to power supply VDD and that is connected in parallel to low-threshold transistor MP2, and transistor MN5 having its source connected to power supply VSS and that is connected in parallel with low-threshold transistors MN1 and MN2. Control signal /ACT is applied as input to the gate of transistor MN5, and control signal ACT is applied as input to the gate of transistor MP5.

FIG. 15 is a circuit diagram showing an example of the configuration of cut-off NOR. The cut-off NOR shown in FIG. 15 is of a configuration that includes, in the cut-off NOR shown in FIG. 6: transistor MP5 that has its source connected to power supply VDD and that is connected in parallel to low-threshold transistors MP1 and MP2, and transistor MN5 that has its source connected to power supply VSS and that is connected in parallel with low-threshold transistor MN2. Control signal /ACT is applied as input to the gate of transistor MN5, and control signal ACT is applied as input to the gate of transistor MP5.

FIG. 16 is a circuit diagram showing an example of the configuration of a cut-off inverter. The cut-off inverter shown in FIG. 16 is of a configuration that includes, in the cut-off inverter shown in FIG. 7: transistor MP5 that has its source connected to power supply VDD and that is connected in parallel to low-threshold transistor MP1, and transistor MN5 that has its source connected to power supply VSS and that is connected in parallel to low-threshold transistor MN1. Control signal /ACT is applied as input to the gate of transistor MN5, and control signal ACT is applied as input to the gate of transistor MP5.

The operation of the Type D cut-off logic is equivalent to that of Type A, and detailed explanation of the operation is therefore here omitted.

When Type D cut-off logic makes a transition to cut-off, rather than each of high-speed transition output signals NF-O and NR-O being pulled to "low" and "high," respectively, by the sub-threshold leak current, the cut-off logic is reset by a cut-off signal. As a result, the receiving transistor gate of the next stage can be placed in either an ON or OFF state at high speed without stopping at an intermediate potential.

Figure 17:
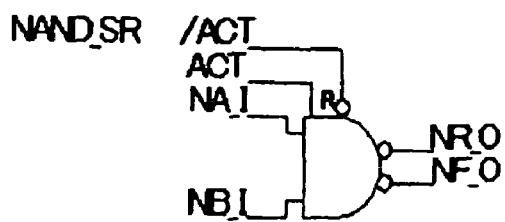
FIG. 17 is a circuit diagram showing an example of the configuration of a NAND circuit having output resetting by ACT and lacking high-speed/low-speed transitions in the input signal of cut-off logic in the first embodiment.
Figure 18:
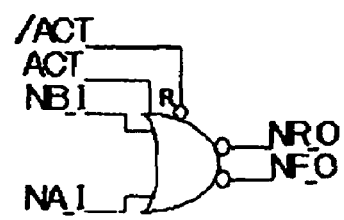
FIG. 18 is a circuit diagram showing an example of the configuration of a NOR circuit having output resetting by means of ACT and lacking high-speed/low-speed transitions in the input signal of cut-off logic in the first embodiment.

Explanation next regards Type E cut-off logic. FIGS. 17 to 19 show the configuration of Type E cut-off logic.

Type E cut-off logic is of a configuration in which, in Type C cut-off logic, high-speed transition output signals NF-O and NR-O are forcibly reset to VSS and VDD, respectively, by control signals ACT and /ACT during cut-off. A brief explanation of each configuration follows below.

FIG. 17 is a circuit diagram showing an example of the configuration of a cut-off NAND. The cut-off NAND shown in FIG. 17 is of a configuration that includes, in the cut-off NAND shown in FIG. 11, transistor MP5 that has its source connected to power supply VDD and that is connected in parallel with low-threshold transistor MP2, and transistor MN5 that has its source connected to power supply VSS and that is connected in parallel to low-threshold transistors MN1 and MN2. Control signal /ACT is applied as input to the gate of transistor MN5, and control signal ACT is applied as input to the gate of transistor MP5.

FIG. 18 is a circuit diagram showing an example of the configuration of cut-off NOR. The cut-off NOR shown in FIG. 18 is of a configuration that includes, in the cut-off NOR shown in FIG. 12, transistor MP5 that has its source connected to power supply VDD and that is connected in parallel to low-threshold transistors MP1 and MP2, and transistor MN5 that has its source connected to power supply VSS and that is connected in parallel to low-threshold transistor MN2. Control signal /ACT is applied as input to the gate of transistor MN5, and control signal ACT is applied as input to the gate of transistor MP5.

FIG. 19 is a circuit diagram showing an example of the configuration of a cut-off inverter. The cut-off inverter shown in FIG. 19 is of a configuration that includes, in the cut-off inverter shown in FIG. 13, transistor MP5 that has its source connected to power supply VDD and that is connected in parallel to low-threshold transistor MP1, and transistor MN5 that has its source connected to power supply VSS and that is connected in parallel to low-threshold transistor MN1. Control signal /ACT is applied as input to the gate of transistor MN5, and control signal ACT is applied as input to the gate of transistor MP5.

The operation of Type E cut-off logic is basically identical to that of Type C, and detailed explanation is therefore here omitted.

As with Type C, this type can be applied to, for example, the initial stage gate of the cut-off logic. The output signal attains the reset state at high speed, and this type of cut-off logic can therefore incorporate Type B, in which cut-off logic realized by control signal ACT is eliminated, in the next and succeeding stages of cut-off logic.

Explanation next regards Type F cut-off logic. FIGS. 20 and 21 show the configuration of Type F cut-off logic.

Type F cut-off logic is a type in which, for the configuration of Type A, rise-side high-speed transitions and fall-side high-speed transitions occur in one input signal of the two input signals that are applied as input to NAND but not in the other input signal, as shown in the logic symbols of FIGS. 20 and 21.

The cut-off NAND shown in FIG. 20 is of a configuration in which, in the cut-off NAND shown in FIG. 5, transistor MN4 is eliminated, and signal NB-I is applied as input to the gates of low-threshold transistor MP2, transistor MP4, and low-threshold transistor MN2.

The cut-off NOR shown in FIG. 21 is of a configuration in which, in the cut-off NOR shown in FIG. 6, transistor MP4 is eliminated, and signal NB-I is applied as input to the gates of low-threshold transistor MP2, transistor MN4, and low-threshold transistor MN2. The operation is basically the same as that of Type A, and detailed explanation of the operation is therefore here omitted.

The present type can be applied when, for example, input signal NB-I that lacks this rise-side high-speed transition and fall-side high-speed transition is the signal from high-threshold logic that is a non-access path.

Explanation next regards Type G cut-off logic. FIGS. 22 and 23 show the configuration of Type G cut-off logic. This is a type in which cut-off logic realized by control signal ACT is eliminated from the Type F configuration.

The cut-off NAND shown in FIG. 22 is of a configuration in which, in the cut-off NAND shown in FIG. 8, transistor MN4 is eliminated, and signal NB-I is applied as input to the gates of low-threshold transistor MP2, transistor MP4, and low-threshold transistor MN2.

The cut-off NOR shown in FIG. 23 is of a configuration in which, in the cut-off NOR shown in FIG. 9, transistor MP4 is eliminated, and signal NB-I is applied as input to the gates of low-threshold transistor MP2, transistor MN4, and low-threshold transistor MN2. The operation is basically identical to that of Type F, and detailed explanation is therefore here omitted.

Explanation next regards Type H cut-off logic. FIGS. 24 and 25 show the configuration of Type H cut-off logic.

The cut-off NAND shown in FIG. 24 is of a configuration in which transistor MN4 that is connected in parallel with low-threshold transistor MN2 is provided in the cut-off NAND shown in FIG. 22. Control signal /ACT is applied as input to that gate of transistor MN4.

The cut-off NOR shown in FIG. 25 is of a configuration in which transistor MP4 that is connected in parallel with low-threshold transistor MP2 is provided in cut-off NOR shown in FIG. 23. Control signal ACT is applied as input to the gate of transistor MP4.

Operation determines whether the non-high-speed transition logic input NB-I of Type G configuration becomes "high" or "low" during cut-off, and low-threshold transistor MN2 may be turned OFF. In this case, high-speed transition output signal NF-O can be reset to VSS by the sub-threshold leak current, but this process takes time and carries the potential of generating a feedthrough current depending on the configuration of the logic of the next stage.

Taking the cut-off NAND shown in FIG. 24 to explain a countermeasure to this problem, the generation of this feedthrough current can be prevented in this type by adding transistor MN4 parallel to low-threshold transistor MN2 and forcibly pulling out high-speed transition output signal NF-O by means of control signal ACT (/ACT).

Figure 26:
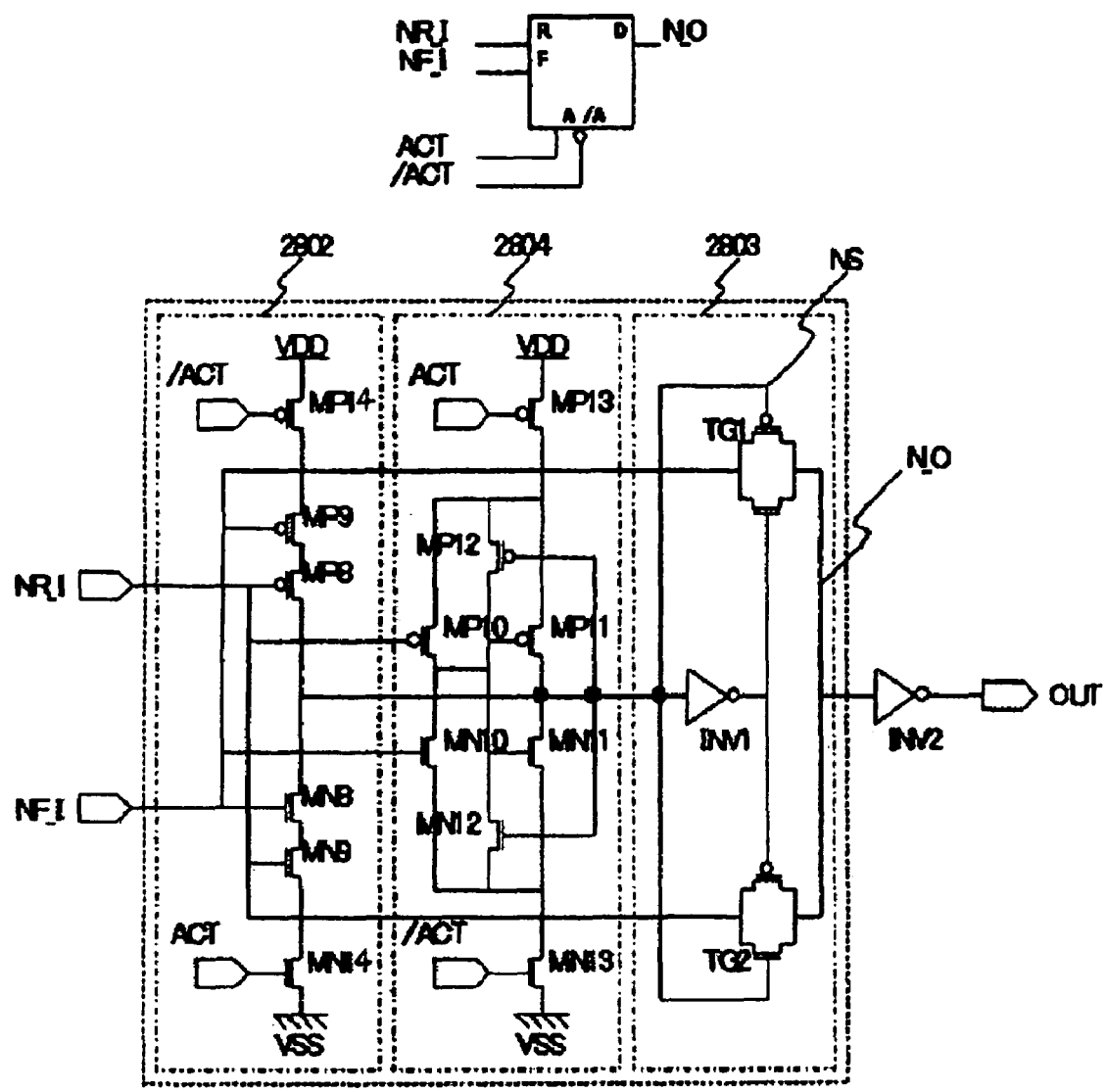
FIG. 26 is a circuit diagram showing an example of the configuration of the high-speed transition detection/holding circuit in the first embodiment.
Figure 27:
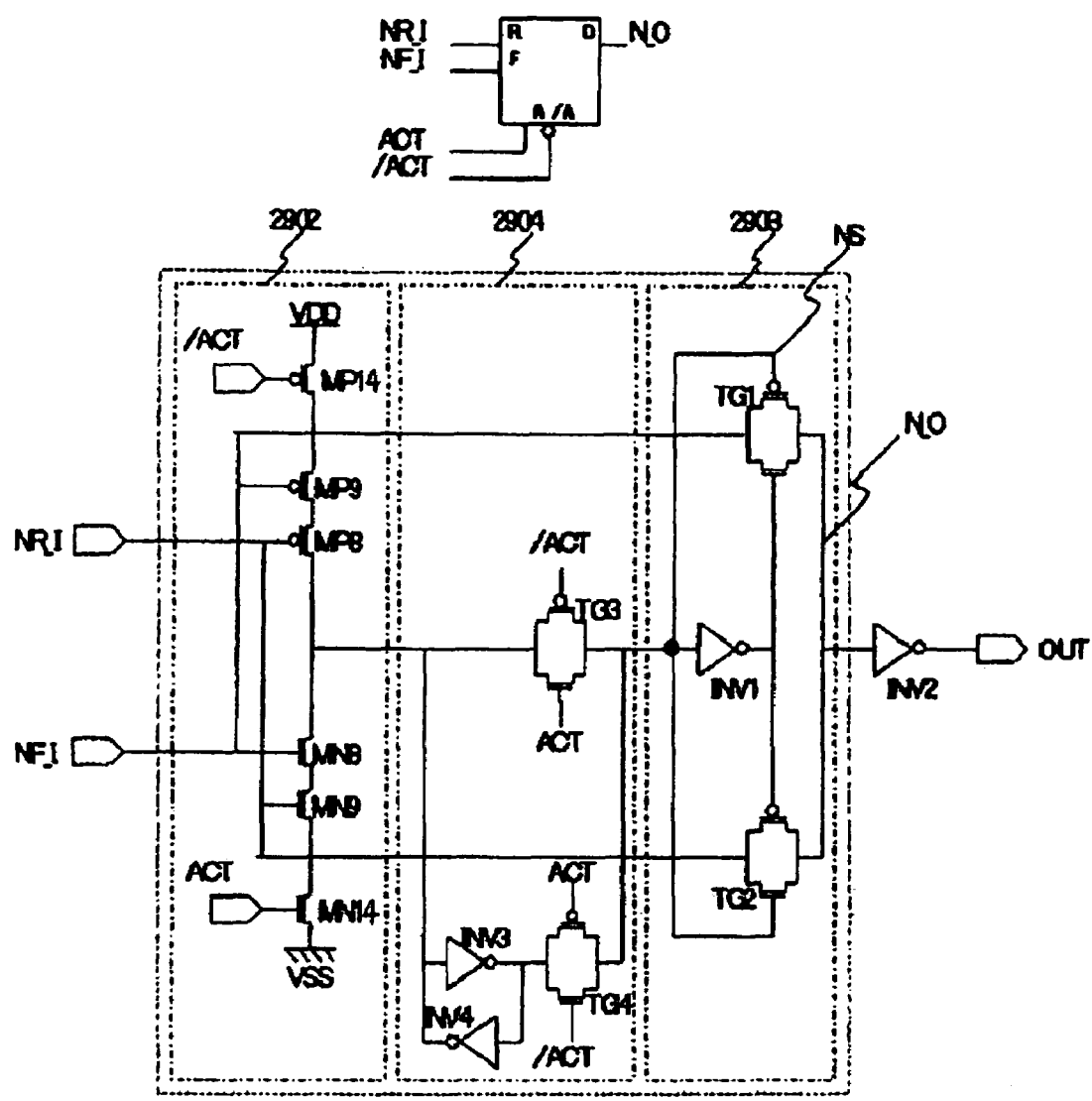
FIG. 27 is a circuit diagram showing another example of the configuration of the high-speed transition detection/holding circuit in the first embodiment.
Figure 28:
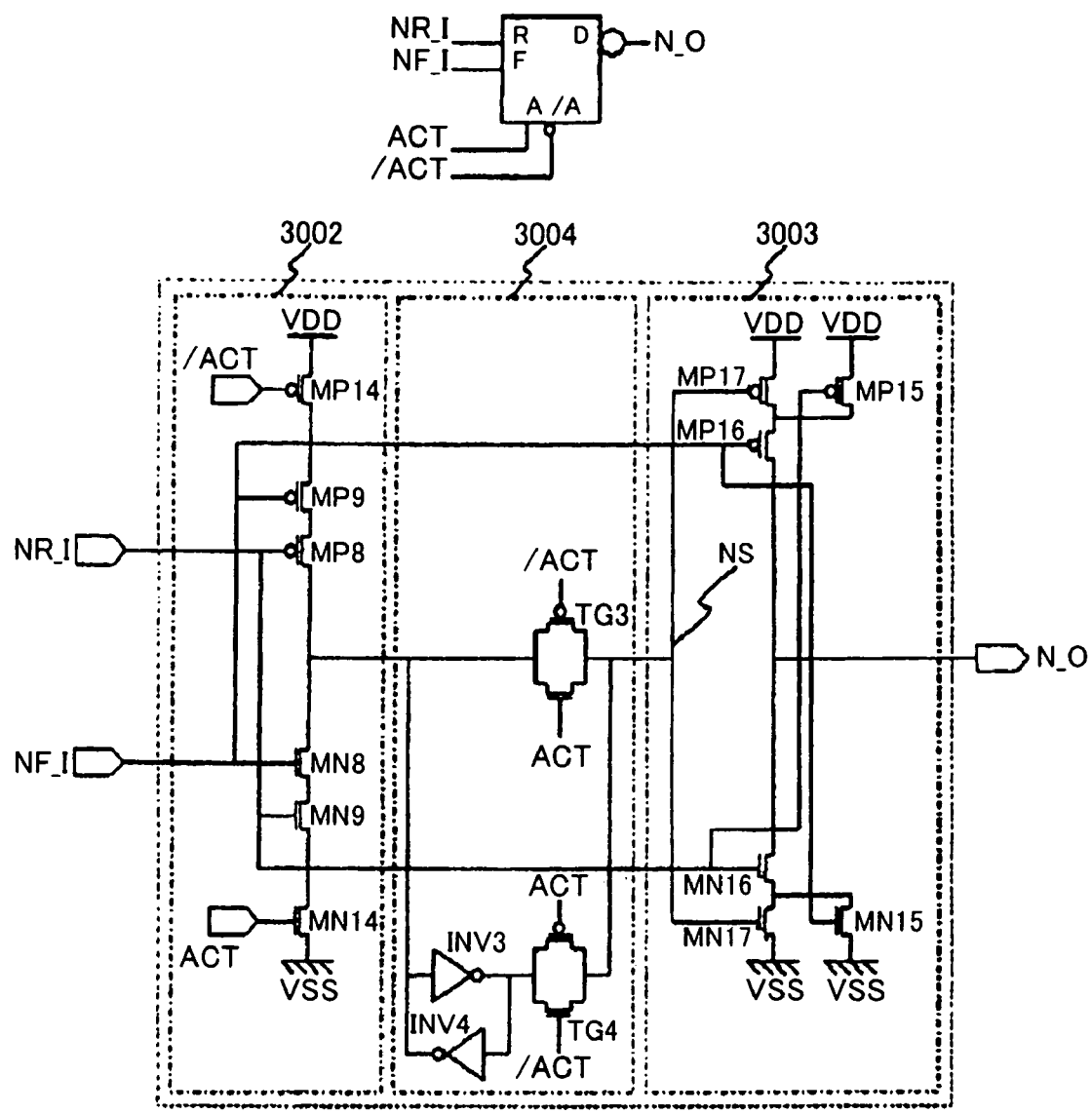
FIG. 28 is a circuit diagram showing another example of the configuration of the high-speed transition detection/holding circuit in the first embodiment.

Explanation next regards the configuration of high-speed transition detection/holding circuit 100. FIGS. 26 to 28 are circuit diagrams showing an example of the configuration of a high-speed transition detection/holding circuit. In addition, the constructions indicated by reference numerals 2802, 2902, and 3002 correspond to high-speed transition detection unit 102 shown in FIG. 3. Similarly, the constructions indicated by reference numerals 2804, 2904, and 3004 correspond to cut-off time data holding unit 104, and the constructions indicated by reference numerals 2803, 2903, and 3003 correspond to high-speed transition output unit 103. In addition, FIG. 26 has already been explained in FIG. 3, and detailed explanation is therefore here omitted.

In the high-speed transition detection/holding circuit shown in FIG. 27, high-speed transition detection unit 102 and high-speed transition output unit 103 are of the same configuration as in high-speed transition detection/holding circuit 100 shown in FIG. 3. As shown in FIG. 27, cut-off time data holding unit 2904 includes: inverters INV3 and INV4 for holding inverted signals of the output from high-speed transition detection unit 2902 at the cut-off start time, and transfer gates TG3 and TG4 for switching the output of high-speed transition detection unit 2902 and inverter INV3. During operation, transfer gate TG3 turns ON and the output from high-speed transition detection unit 2902 is applied as signal NS to high-speed transition output unit 2903. During standby, transfer gate TG4 turns ON and the output from inverter INV3 is applied as signal NS to high-speed transition output unit 2903.

In the high-speed transition detection/holding circuit shown in FIG. 28, high-speed transition detection unit 2902 and cut-off time data holding unit 2904 are of the same configuration as in the high-speed transition detection/holding circuit shown in FIG. 27. As shown in FIG. 28, high-speed transition output unit 3003 includes: transistors MP17, MP16, MN16, and MN17 that are connected in a series between power supply VDD and power supply VSS; transistor MP15 that is connected in parallel with transistor MP17; and transistor MN15 that is connected in parallel with transistor MN17. The output signal from cut-off time data holding unit 3004 is applied to the gates of transistors MP17 and MN17. Input signal NF-I is applied as input to the gates of transistors MP16 and MN15, and input signal NR-I is applied as input to the gates of transistors MP15 and MN16. The potential of the drains of transistors MP16 and MN16 is supplied as signal N-O.

Explanation next regards the operation of the high-speed transition detection/holding circuit. In this explanation, the reference numerals of the configuration of FIG. 26 will be used from among the examples of configurations of FIGS. 26 to 28. Unless specifically stated, the operation is the same for the cases of FIGS. 27 and 28, and explanation of the details of this operation is therefore here omitted.

Each of rise-side high-speed transition signal and fall-side high-speed transition signal that are supplied as output from cut-off logic are applied as input to NR-I and NF-I, respectively, shown in FIG. 26. High-speed transition detection unit 2802 supplies "low" when rise-side high-speed transition signal NR-I and fall-side high-speed transition signal NF-I are both "high," supplies "high" when these input signals are both "low," and otherwise supplies "Hi-Z."

High-speed transition output unit 2803, upon receiving output from high-speed transition detection unit 2802, supplies only the high-speed-side transition signal to N-O, and when the high-speed transition side completes transition, switches to supply the path on the opposite side. High-speed transition output unit 2803 supplies data N-O of the same phase as input data NR-I/NF-I. High-speed transition output unit 2903 shown in FIG. 27 also supplies data N-O of the same phase as input data NR-I/NF-I, but high-speed transition output unit 3003 shown in FIG. 28 supplies data of the reverse phase.

Cut-off time data holding unit 2804 supplies Hi-Z during operation (when ACT is "high" and /ACT is "high"), but switches the selection of the high-speed transition side output circuit during cut-off (when ACT is "low" and /ACT is "high"). In other words, NR-I transitions to "high" and NF-I transitions to "low" during cut-off, and as a result, if cut-off time data holding unit 2804 is not included, the node with the signal line of control signal NS becomes Hi-Z and N-O is directed to supply "undefined" as output. When control signal NS holds the operation state, the input data are changed by the sub-threshold leak current, and the opposite data are supplied in the output. To prevent this result, cut-off time data holding unit 2804 switches such that the input signal is reversed only during cut-off.

Explanation next regards the operation of the logic circuit shown in FIG. 3.

Figure 29:
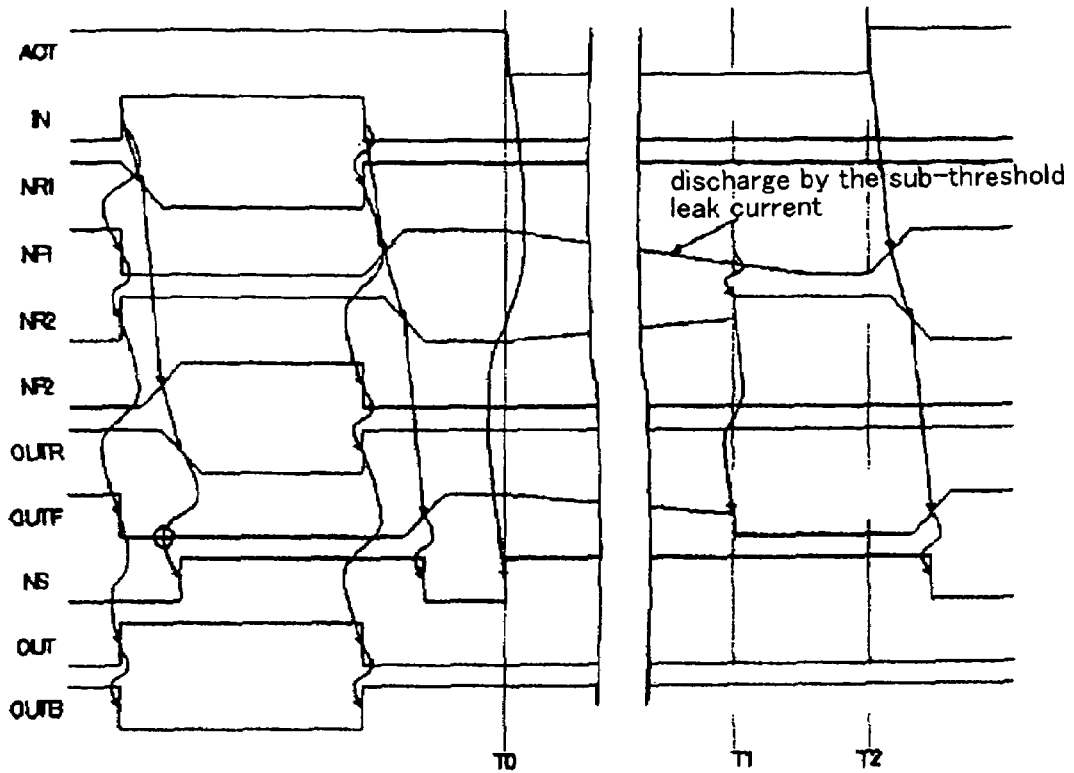
FIG. 29 is a timing chart of a logic circuit in the first embodiment.

FIG. 29 is a timing chart of the logic circuit shown in FIG. 3. As shown in FIG. 3, three stages of inverters are applied in cut-off logic circuit 101. The first stage of the three stages of inverters is the inverter shown in FIG. 13, and the middle and last stages are the inverter shown in FIG. 7. In addition, the circuit shown in FIG. 26 is applied in high-speed transition detection/holding circuit 100.

As shown in FIG. 3, input signal IN is applied as input to the gates of low-threshold transistors MN1 and MP1. When the input signal transitions from "low" to "high," low-threshold transistor MN1 is turned ON and MP1 is turned OFF. Receiving the ON of low-threshold transistor MN1, output signal NF1 rapidly transitions from "high" to "low," but output signal NR1 transitions from "high" to "low" by way of high-threshold transistor MN0 and MP0, which are of high resistance. These output signals NF1 and NR1 are applied as input to the cut-off inverter of the next stage. Output signal NF1 is applied to low-threshold transistor MP3 and transistor MN4, and thus turns MP3 ON and MN4 OFF. At this time, output signal NR1 is still "high," whereby transistor MP4 turns OFF and low-threshold transistor MN3 turns ON. Accordingly, due to low-threshold transistor MP3, output signal NR2 rapidly becomes "high." Output signal NR1 then transitions from "high" to "low," low-threshold transistor MN3 turns OFF, and transistor MP4 turns ON. The ON of MP4 causes the signal lines of output signals NR2 and NF2 to connect, but the high resistance of high-threshold transistors MP2 and MN2 and transistor MP4 causes output signal NF2 to slowly transition from "low" to "high."

Output signal NR2 that rapidly transitions from "low" to "high" is received by low-threshold transistor MN6 and transistor MP7, whereby low-threshold transistor MN6 turns ON and transistor MP7 turns OFF. Because output signal NF2 is "low" at this time, transistor MN7 is OFF. Accordingly, the ON of low-threshold transistor MN6 causes output signal OUTF to rapidly transition from "high" to "low," following which the transition of output signal NF2 from "low" to "high" causes low-threshold transistor MP6 to turn OFF and transistor MN7 to turn ON, whereby short-circuiting occurs between the signal lines of OUTF and OUTR. However, the high resistance of transistor MP7 and high-threshold transistors MN5 and MP5 causes output signal OUTR to slowly transition from "high" to "low."

When output signals OUTF and OUTR are "high," PMOS transistors MP8 and MP9 turn OFF and NMOS transistors MN8 and MN9 turn ON, whereby transfer gate TG1 turns ON and transfer gate TG2 turns OFF. Accordingly, when OUTF transitions from "high" to "low," OUT transitions from "high" to "low" and output OUTB transitions from "low" to "high." After OUTF transitions to "low," OUTR slowly transitions from "high" to "low," whereupon transistors MP8 and MP9 turn ON and transistors MN8 and MN9 turn OFF, whereby transfer gate TG1 turns OFF and transfer gate TG2 turns ON. Accordingly, OUTR and OUT short-circuit, but because OUTR is "low," OUT continues to hold "low." As for a case in which input signal IN transitions from "high" to "low," the operation is similar to the above-described transition from "low" to "high" if the PMOS side and NMOS side are read differently, and detailed explanation is therefore here omitted.

As shown in FIG. 29, after the end of operation for transition of input signal IN from "low" to "high" and from "high"

to "low," the operation is completed and control signal ACT is switched from "high" to "low" (/ACT is switched from "low" to "high") (T0). Transistors MP12 and MN12 turn OFF and high-speed transition detection unit 102 supplies Hi-Z, but in contrast, cut-off time data holding unit 104 begins operation. Immediately before control signal ACT changes from "high" to "low," OUTR and OUTF are both "high," and control signal NS is therefore "low." When ACT becomes "low," a "low" signal is applied as input to the gates of transistors MP10 and MN10, and control signal NS becomes "high" by way of the inverter that is made up by transistors MP11 and MN11. In addition, transistors MP11 and MN11 both simultaneously perform data holding by way of transistors MP12 and MN12. As described above, in the state in which control signal ACT is "high," control signal NS is "low" and turns TG1 ON, and the "high" output signal line of OUTF connects with the signal line of OUT. When control signal ACT becomes "low," control signal NS becomes "high," turns ON TG2, and "high" output signal line of OUTR connects with the signal line of OUT. The sub-threshold leak current of low-threshold transistors MN1, MP3, and MN6 then causes output signal NF1 to transition from "high" to "low," output signal NR2 to transition from "low" to "high," and OUTF to transition from "high" to "low" (T1), but the signal line of OUTR that is connected with the signal line of OUT continues to hold "high," whereby output signals OUT and OUTB continue to hold the data of the state in which ACT is "low."

In the return to the ACT state (T2), control signal ACT first becomes "high," whereby high-threshold transistors MN0 and MP0, low-threshold transistors MN1 and MP1, and high-threshold transistors MN5 and MP5 turn ON, output signal NF1 transitions from "low" to "high," output signal NR2 transitions from "high" to "low," and output signal OUTF transitions from "low" to "high." When output signal OUTF becomes "high," transistors MN9 and MN8 turn ON, and control signal NS is switched from "high" to "low." The signal lines of output signals OUTF and OUT are connected, but output signal OUTF has already returned to "high" and output signal OUT therefore holds the previous state without change.

Figure 30:
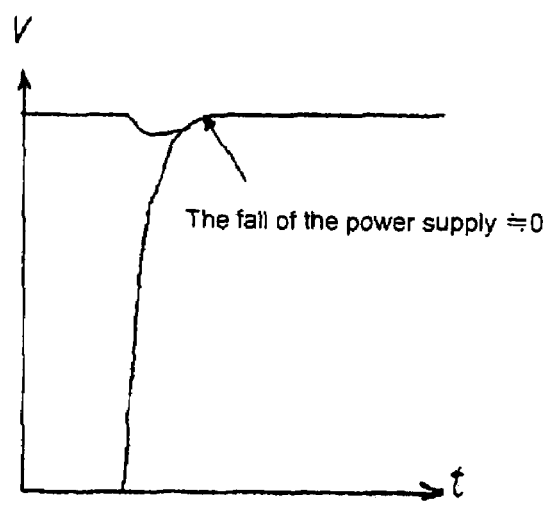
FIG. 30 is a schematic diagram showing the power supply waveform of a logic gate of the present invention.

As shown in FIG. 30, the fall of the power supply voltage that is applied to the low-threshold transistors of the logic circuit in the present embodiment is reduced as compared to the prior art. As a result, rapid operation can be realized at low voltage.

Figures 1A, 1B:
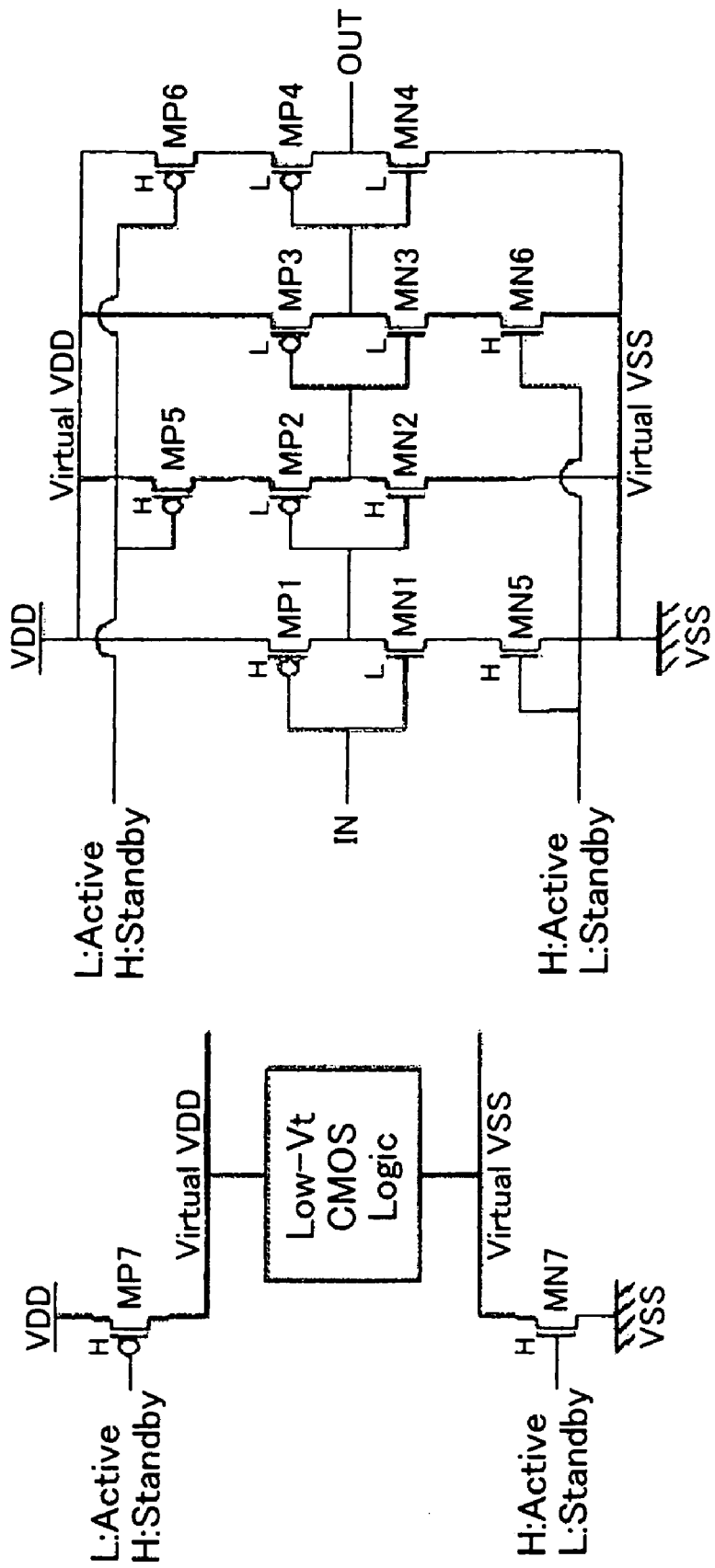
FIGS. 1A and 1B show examples of the configuration of logic circuits of the prior art.
Figure 2:
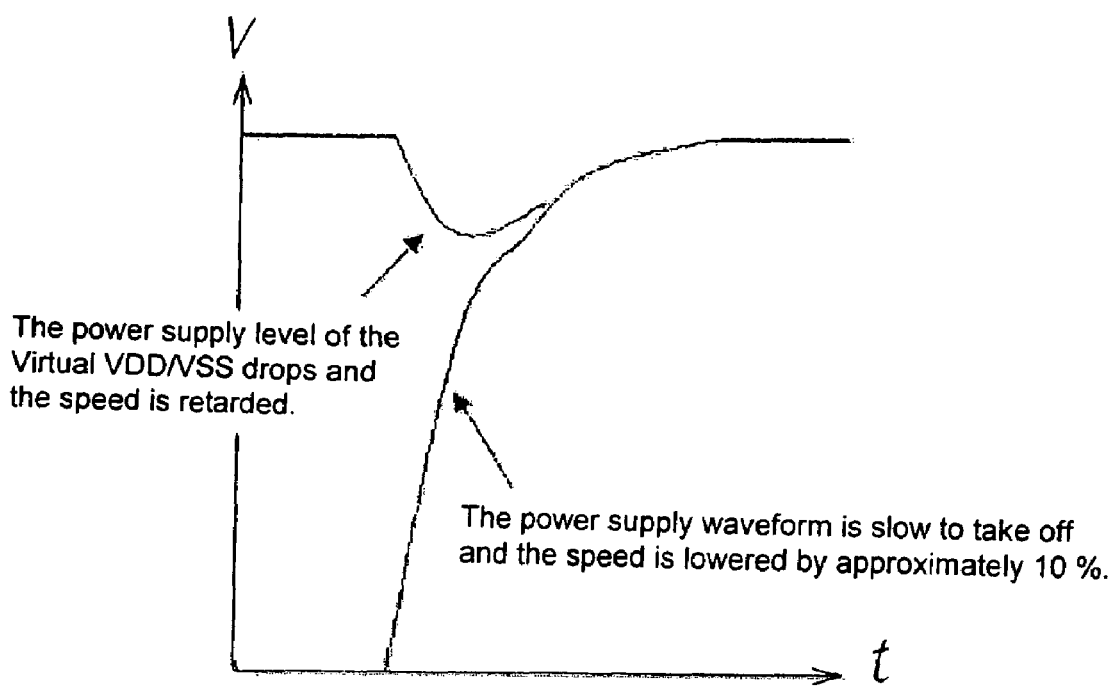
FIG. 2 is a schematic view of the change of the power supply waveform of a logic gate of the prior art.

In the prior art, in a mode in which cut-off logic is on the power-supply side as shown in FIGS. 1A and 1B, placing the low-threshold logic in operation causes a major drop in the power supply level as shown in FIG. 2, whereby the Vds of transistors cannot be obtained and operation is slowed. However, in the present invention, as described in FIG. 4, the power supply side is not a virtual power supply, and as shown in FIG. 2, the drop in the power supply is extremely small and a large Vds can be obtained, thus enabling high-speed operation. Further, as shown in FIG. 4, the feedthrough current from VDD to VSS that occurs during switching is almost completely eliminated even in low-threshold logic, thus enabling high-speed operation.

The present embodiment further enables operation with low current consumption at low voltage. In the prior art, it was normally necessary to increase the size of the supply transistors to the virtual power supply to eliminate the drop in the virtual power supply shown in FIG. 1. This increase in size resulted in an increase of the charge/discharge current to the gates of these transistors, and the current consumption effect realized by low-voltage operation was therefore lost. In contrast, as shown in FIG. 4 in the present embodiment, the huge cut-off transistors shown in FIG. 1 can be constituted by small transistors such as MP0 and MN0, and the increase in current consumption can therefore be reduced.

Still further, the present embodiment enables a rapid return to operation from standby. In the prior art, the power supply was cut, and a time period of at least several hundred ns was therefore required for the internal level that had been cut to recover. In the present embodiment, however, a data holding function is provided in the output unit of the cut-off circuit whereby, despite cut-off, the output signal level is held before cut-off to enable a rapid return from cut-off without charge or discharge of the output signal.

Although explanation of the cut-off logic of the present embodiment regarded the circuit configuration of NAND, NOR, and inverters, the present invention can also be applied to multiple-input NAND have three or more inputs or to compound logic gates in which NAND, NOR, and inverters are combined.

Second Embodiment

Explanation next regards the details of the present embodiment with reference to the accompanying figures.

The circuits shown in each of FIGS. 31, 32, and 33 are circuits in which the points of insertion of MN0 and MP0, which are cut-off transistors, in the circuits shown in FIGS. 5, 6, and 7 have been modified. The configuration of each cut-off logic is briefly described.

The cut-off NAND shown in FIG. 31 is of a configuration in which the connection destination of high-threshold transistor MN0 in the cut-off NAND shown in FIG. 5 has been altered from low-threshold transistor MP1 to low-threshold transistor MN1.

The cut-off NOR shown in FIG. 32 is of a configuration in which the connection destination of high-threshold transistor MN0 in the cut-off NOR shown in FIG. 6 has been altered from low-threshold transistor MP1 to low-threshold transistor MN1, and with this alteration, the connection destination of transistor MN4 has been altered from low-threshold transistor MN1 to low-threshold transistor MP1.

The cut-off inverter shown in FIG. 33 is of a configuration in which transistor MN2 and high-threshold transistor MN0 in the cut-off inverter shown in FIG. 7 have been replaced.

Although the positions of these cut-off transistors have been altered, the operation itself is completely unchanged. In other words, these cut-off transistors MP0 and MN0 may be inserted at any point between the signal lines of rise-side high-speed transition output signal NR-O and fall-side high-speed transition output signal NF-O. These insertion locations can also be applied to all of FIGS. 5 to 25.

Although high-threshold transistors having negligible sub-threshold leak current were used as cut-off transistors MN0 and MP0 in the first embodiment, no particular problems arise if, instead of using high-threshold transistors, transistors of normal threshold voltages or low-threshold transistors are used, as long as the total sub-threshold leak current of MP0, MN0, and transistors that are further connected in a series to MP0 and MN0 is a negligible value. The same effect can be obtained in the second embodiment as in the first embodiment. The following explanation regards the configuration and operation of specific working examples that use any of the logic gates and logic circuits of the first embodiment and second embodiment.

Regarding logical symbols in the figures, it will be assumed that logical symbols that are identical to the logical symbols represented over the circuit diagrams of each cut-off logic that was explained in the first embodiment have the same functions.

WORKING EXAMPLE 1

Figure 34:
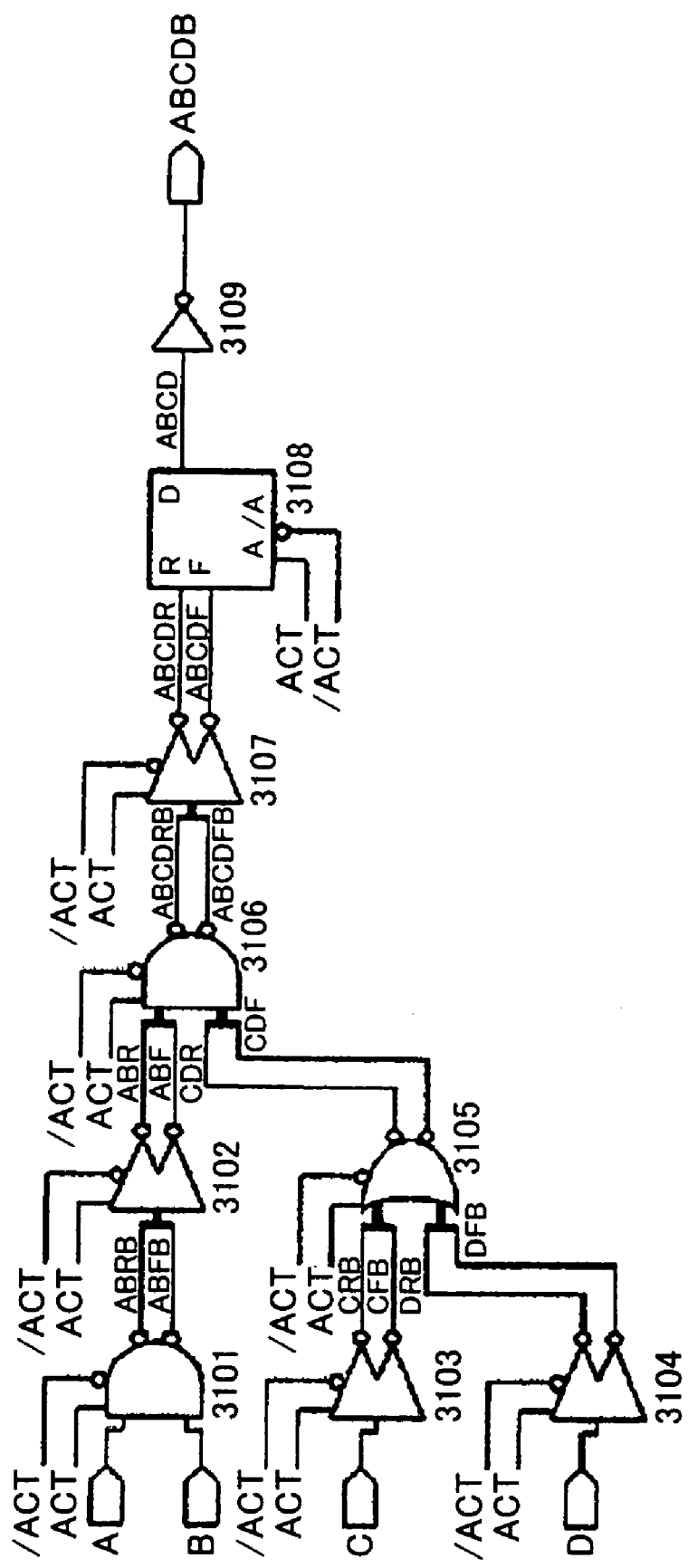
FIG. 34 is a symbol diagram showing the logic circuit of the first working example.

FIG. 34 is a block diagram showing the configuration of a logic circuit of the present working example. In the present working example, operation is described for a case in which the state undergoes a transition due to the natural generation of a leak current by the transistor during cut-off.

The logic circuit of the present working example includes: cut-off NAND 3101 and cut-off inverters 3103 and 3104 of the first stage of input; cut-off inverter 3102 and cut-off NOR 3105 of the second stage; cut-off NAND 3106 of the third stage; cut-off inverter 3107 of the fourth stage; and high-speed transition detection/holding circuit 3108 connected on the output side of cut-off inverter 3107. The present working example uses the cut-off logic shown in FIGS. 5 to 7.

The output signal of cut-off NAND 3101 is applied as input to cut-off inverter 3102. The output signal of cut-off inverters 3103 and 3104 is applied as input to cut-off NOR 3105. The output signals of cut-off inverter 3102 and cut-off NOR 3105 are applied as input to cut-off NAND 3106. The output signal of cut-off NAND 3106 is then applied as input to cut-off inverter 3107.

The input signals are the four signals A, B, C, and D, and the output signal is the one signal ABCDB. The expected value in the cut-off logic circuit of the present working example is that the output signal ABCDB becomes "low" when input signals A, B, C, and D are all "high." Transistors that generate sub-threshold leak current during cut-off are provided in the cut-off logic of the present working example. The operation of each component is similar to that of the first embodiment, and detailed explanation of this operation is therefore here omitted. Explanation here regards the possibility of assembling any logic through a combination of the cut-off logic that was described in the first embodiment.

Figure 35:
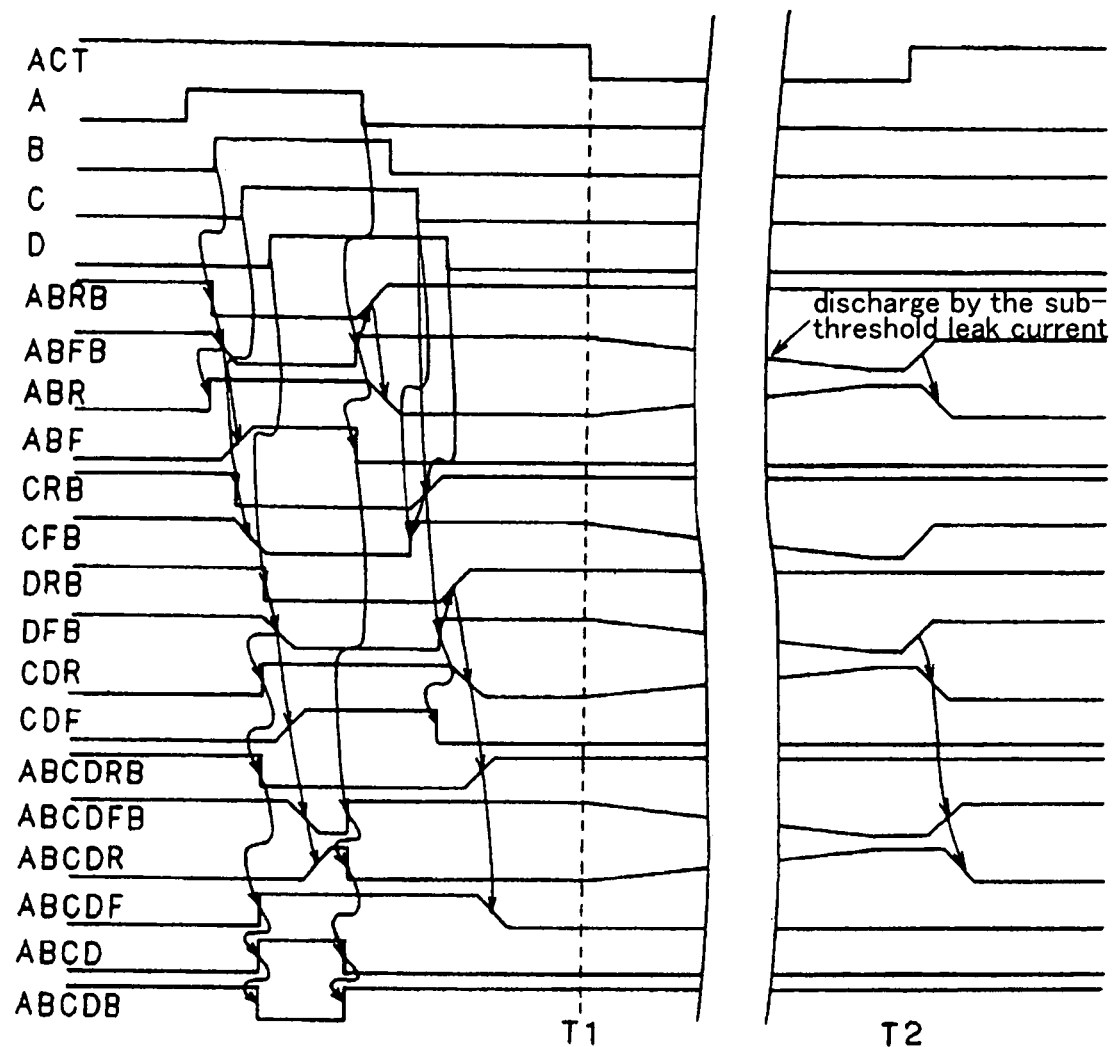
FIG. 35 is a timing chart of the logic circuit shown in FIG. 34.

Explanation next regards the operation of the logic circuit of the present working example. FIG. 35 shows the operation timing of each node when the logic circuit of the present working example is placed in operation.

When input signal A is "high" and B next becomes "high," the output signal ABFB of cut-off NAND 3101 rapidly becomes "low," following which output signal ABRB slowly becomes "low." When cut-off inverter 3102 of the succeeding stage receives these signals, output signal ABR rapidly becomes "high," following which output signal ABF becomes "high."

On the other hand, when signal C that is applied as input to cut-off inverter 3103 becomes "high," output signal CFB rapidly becomes "low," following which output signal CRB becomes "low." As with cut-off inverter 3103, when signal D that is applied as input to cut-off inverter 3104 becomes "high," output signal DFB rapidly becomes "low," following which output signal DRB becomes "low." When signal CFB becomes "low" following which signal DFB becomes "low," the output signal CDR of cut-off NOR 3105 rapidly becomes "high." When both signals CRB and DRB become "low," output signal CDF slowly transitions to "high."

In cut-off NAND 3106 of the succeeding stage, of signals ABR and CDR that are received as input, the transition of the signal for which the change from "low" to "high" is slower is received to cause the rapid transition of output signal ABCDFB from "high" to "low." In addition, of signals ABF and CDF that are received as input, the transition of the signal for which the change from "low" to "high" is slower is received to bring about the slow transition of output signal ABCDRB from "high" to "low." In cut-off inverter 3107 of the next stage, input signal ABCDFB is rapidly inverted to output signal ABCDR, and input signal ABCDRB is slowly inverted to output signal ABCDF. High-speed transition detection/holding circuit 3108 next supplies signal ABCDR as signal ABCD from signal ABCDR, which is the high-speed transition side, and signal ABCDF, which is the low-speed transition side.

Regarding the transition from "high" to "low" of input signals A, B, C, and D, output signal ABCD transitions by means of the same operation as described above. Signal ACT subsequently becomes "low" at T1, and upon change to the cut-off state, signals ABFB, CFB, DFB, ABCDFB of each cut-off logic end operation in the VDD state, but sub-threshold leak current that is generated with the VSS side causes a gradual change to "low." On the other hand, signals ABR, CDR, and ABCDR end operation in the VSS state, but the sub-threshold leak current that is generated with the VDD side causes a gradual change to "high." When signal ACT becomes "high" at T2, nodes that are discharged by the sub-threshold leak current recover in order. When signal ABRB first returns from "low" to "high," signal ABR returns from "high" to "low." The other discharged nodes all return in order from the preceding stage.

WORKING EXAMPLE 2

Figure 36:
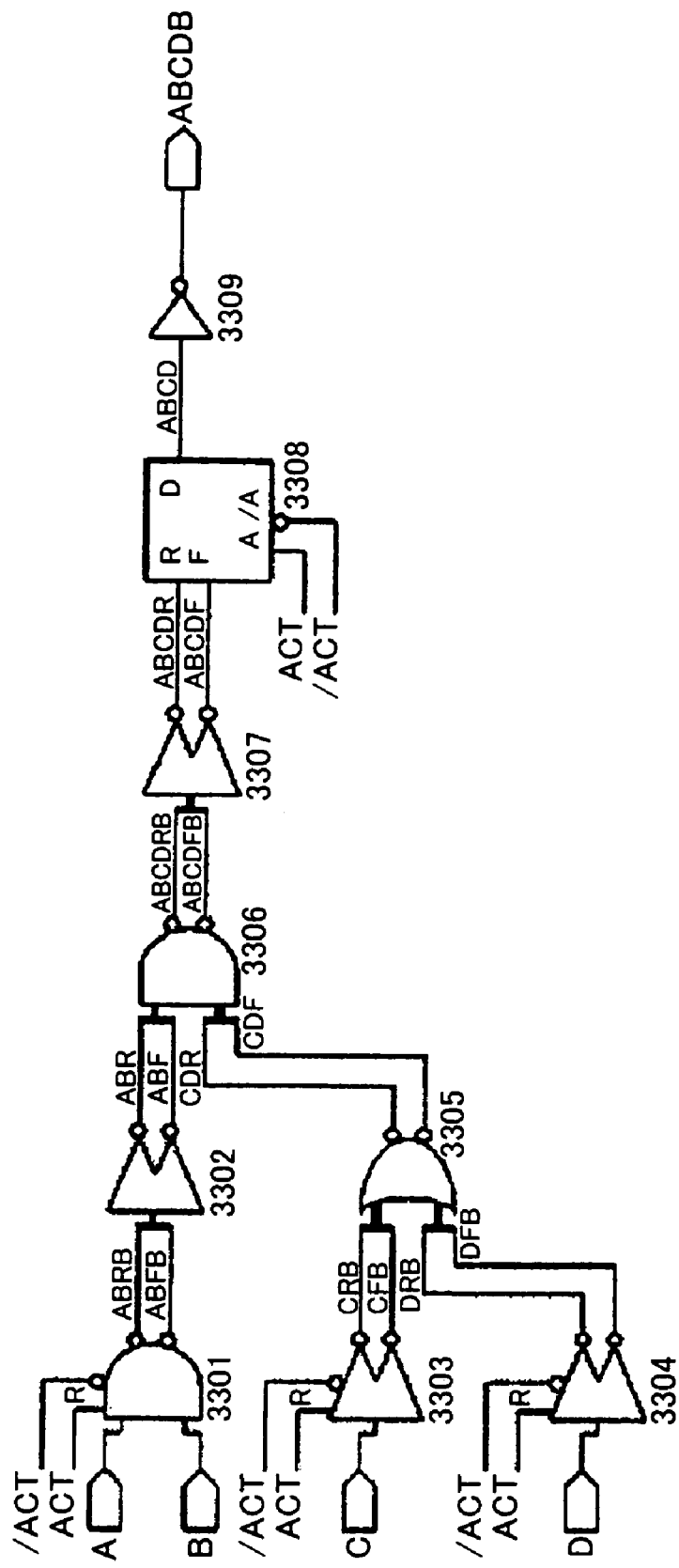
FIG. 36 is a symbol diagram showing the logic circuit of the second working example.

FIG. 36 is a block diagram showing the configuration of the logic circuit of the present working example. The point of difference with working example 1 is the use of the cut-off logic shown in FIGS. 8 to 10 in the second and succeeding stages after input of the logic circuit shown in FIG. 36. The logic configuration is absolutely identical to working example 1, but cut-off control realized by the ACT signal is used only in the initial stages of cut-off NAND 3301 and cut-off inverters 3303 and 3304, and the ACT signal does not enter the next and succeeding stages. The operation is therefore the same as in working example 1 during operation when the ACT signal is "high," and detailed explanation of this operation is therefore here omitted.

Figure 37:
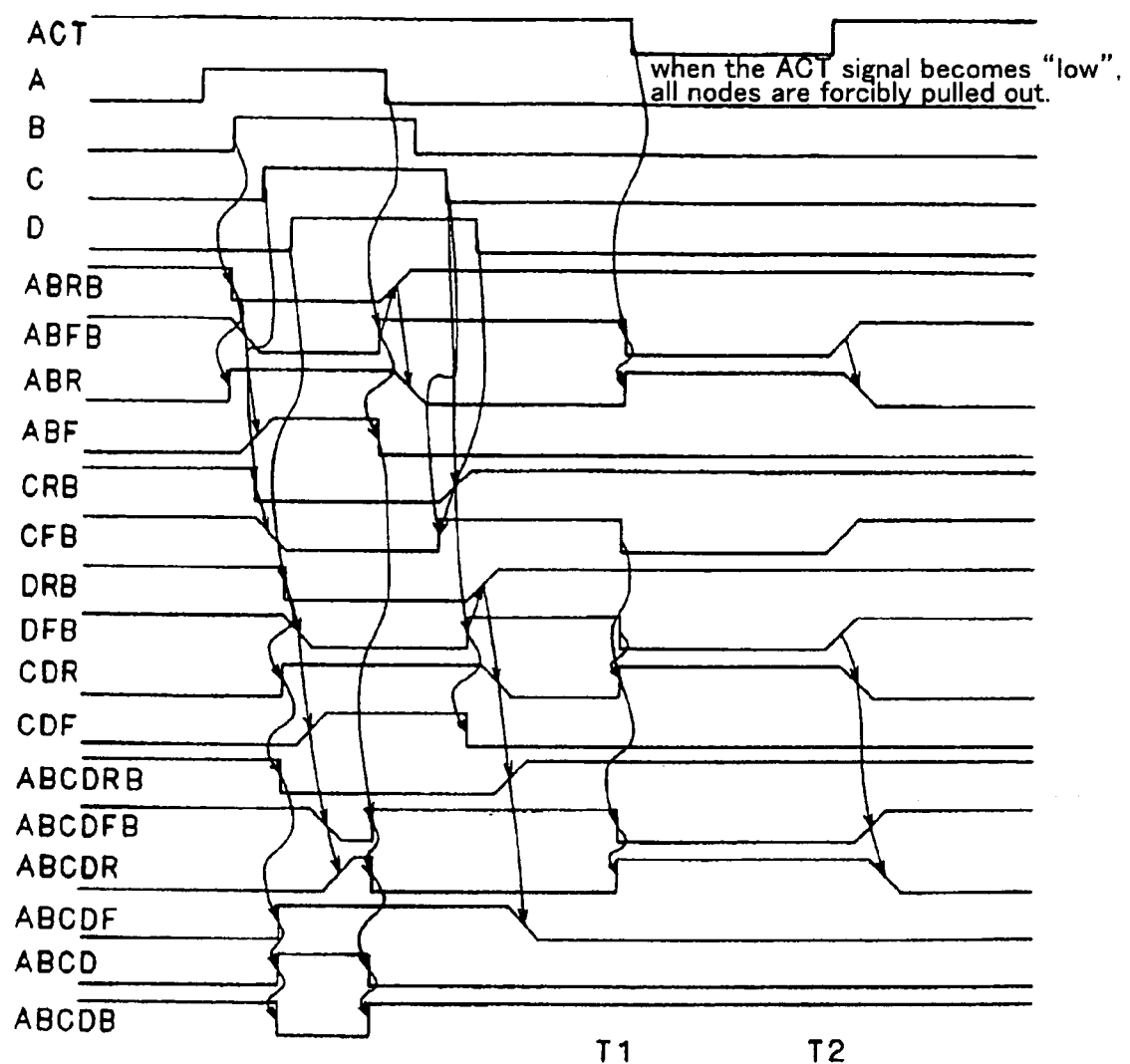
FIG. 37 is a timing chart of the logic circuit shown in FIG. 36.

FIG. 37 shows a timing chart. T1 is the time of the start of cut-off caused by a "low" ACT signal. When the ACT signal becomes "low," the output signal ABRB of cut-off NAND 3301 is reset to "high" and output signal ABFB is reset to "low." In the present working example, signal ABRB is "high" from the outset and therefore is unchanged by resetting. Similarly, signals CFB and DFB are reset from "high" to "low." In cut-off inverter 3302, the "low" of signal ABFB is received and output signal ABR is reset to "high." In cut-off NOR, the "low" of signal CFB and signal DFB is received and output signal CDR is reset to "high."

Cut-off NAND 3306 of the next stage receives the "high" of signal ABR and the "high" of signal CDR to reset output signal ABCDFB to "low." Cut-off inverter 3307 of the next stage resets output signal ABCDR to "high." High-speed transition detection/holding circuit 3308 does not allow both input signals ABCDR and ABCDF to pass in the state in which the ACT signal is "low" and thus holds output signal ABCD at "low."

In the present working example, the next and succeeding stages are rapidly reset by the resetting of the ACT signal as described hereinabove to eliminate the time that each node is an intermediate node. In addition, because cut-off transistors that are controlled by the ACT signal can be cut back, the present working example can achieve a greater reduction of the number of logic than working example 1.

WORKING EXAMPLE 3

Figure 38:
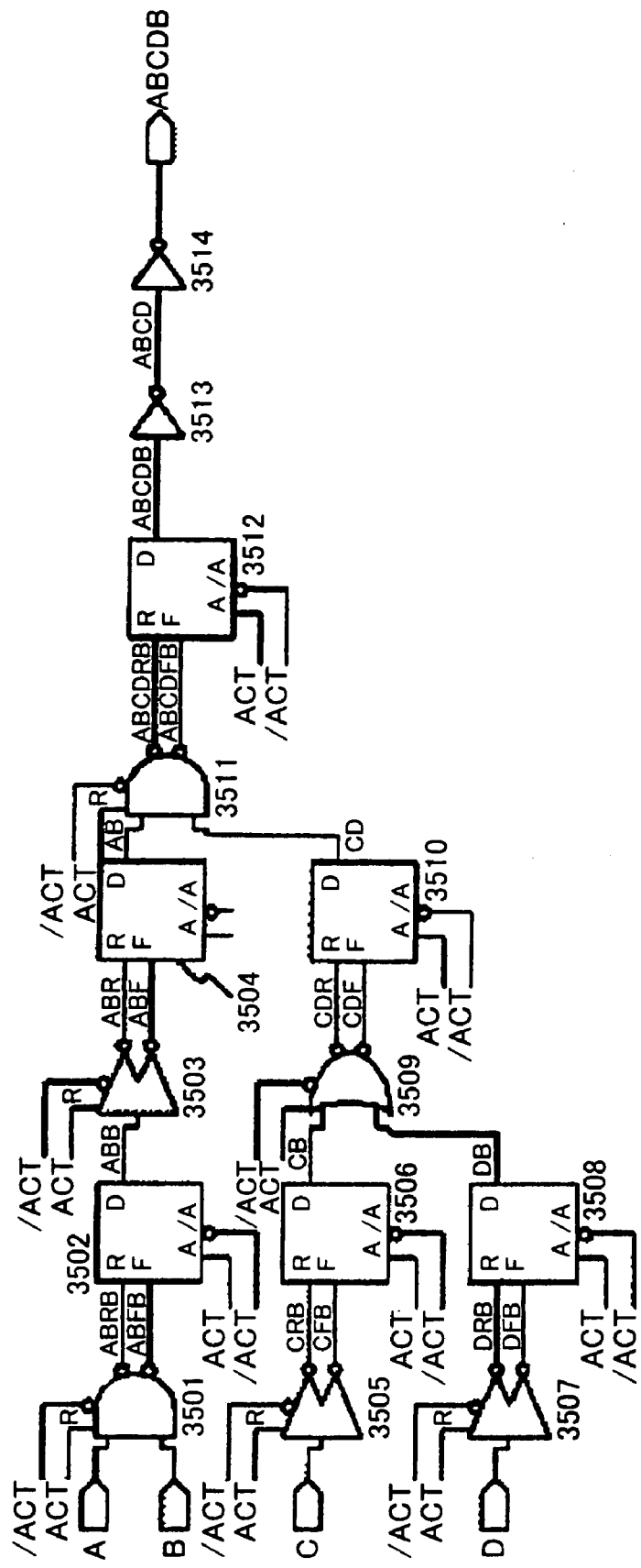
FIG. 38 is a symbol diagram showing the logic circuit of the third working example.

FIG. 38 is a block diagram showing the configuration of cut-off logic of the present working example. The present working example differs from working example 2 in that rise-side high-speed transition signals and fall-side high-speed transition signals that have passed through cut-off logic first undergo shaping in a high-speed transition detection/holding circuit and are then applied to the cut-off logic of the next stage.

As shown in FIG. 38, in the logic circuit of the present working example, high-speed transition detection/holding circuits 3502, 3506, and 3508 are connected to the output of each of cut-off NAND 3501 and cut-off inverters 3505 and 3507 of the first input stage, respectively. High-speed transition detection/holding circuits 3504 and 3510 are connected to the outputs of cut-off inverter 3503 and cut-off NOR 3509, respectively, of the second stage. Further, high-speed transition detection/holding circuit 3512 is connected to the output of cut-off NAND 3511 of the third stage.

In the present working example, all signals that are applied as input to cut-off logic are signals that lack a high-speed side and low-speed side, and control by ACT signals is therefore necessary in all cut-off logic.

Figure 39:
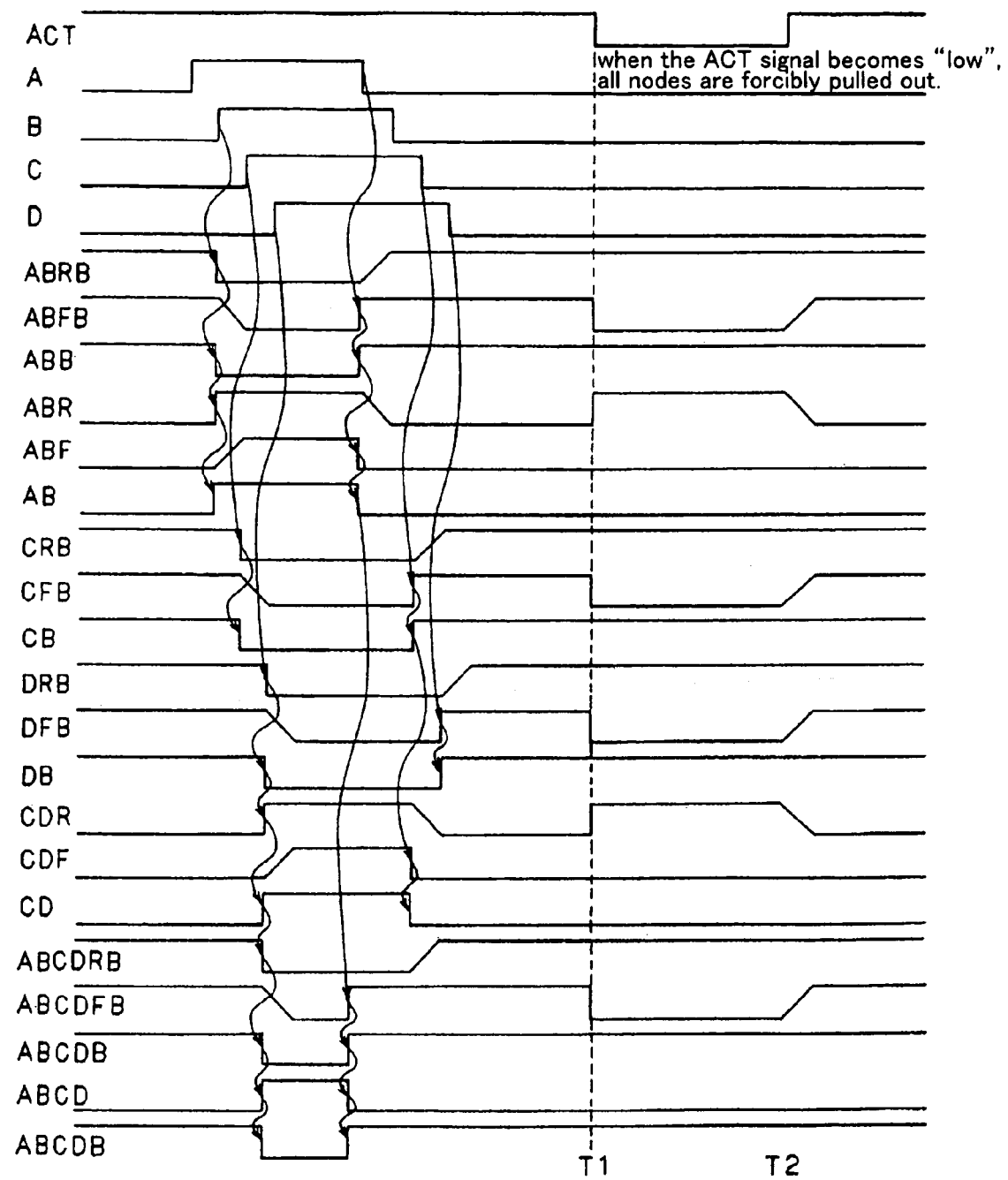
FIG. 39 is a timing chart of the logic circuit shown in FIG. 38.

FIG. 39 shows a timing chart. T1 is the time of the start of cut-off resulting from "low" of the ACT signal. When the ACT signal becomes "low," all nodes are forcibly pulled out.

Explanation here regards the problems when cut-off logic is constituted by multiple stages. In the case of a logic circuit in which cut-off logic is constituted by multiple stages, reception of a low-speed side transition signal of a preceding stage means transfer of the low-speed side transition signal to the next stage. This signal transfer operation causes a great delay in the input of the low-speed side transition signal to the next stage. Operation errors occur when this low-speed side transition signal is overtaken by a signal that is received in the next cycle. In the present working example, high-speed transition detection/holding circuits are provided in the outputs of all cut-off logic to perform wave-shaping and thus suppress the occurrence of operation errors, but wave-shaping is more preferable when a case is assumed in which the signal of a succeeding cycle threatens to catch up.

Although the circuit shown in either of FIG. 26 and FIG. 27 is employed in the present working example as the high-speed transition detection/holding circuit, the occurrence of undefined output during cut-off does not actually cause a problem and the cut-off time data holding unit therefore need not be provided.

WORKING EXAMPLE 4

Explanation next regards an example of the configuration of the layout of cut-off logic in the present working example. In this case, explanation regards a case in which two stages of cut-off inverters are connected.

Figure 40:
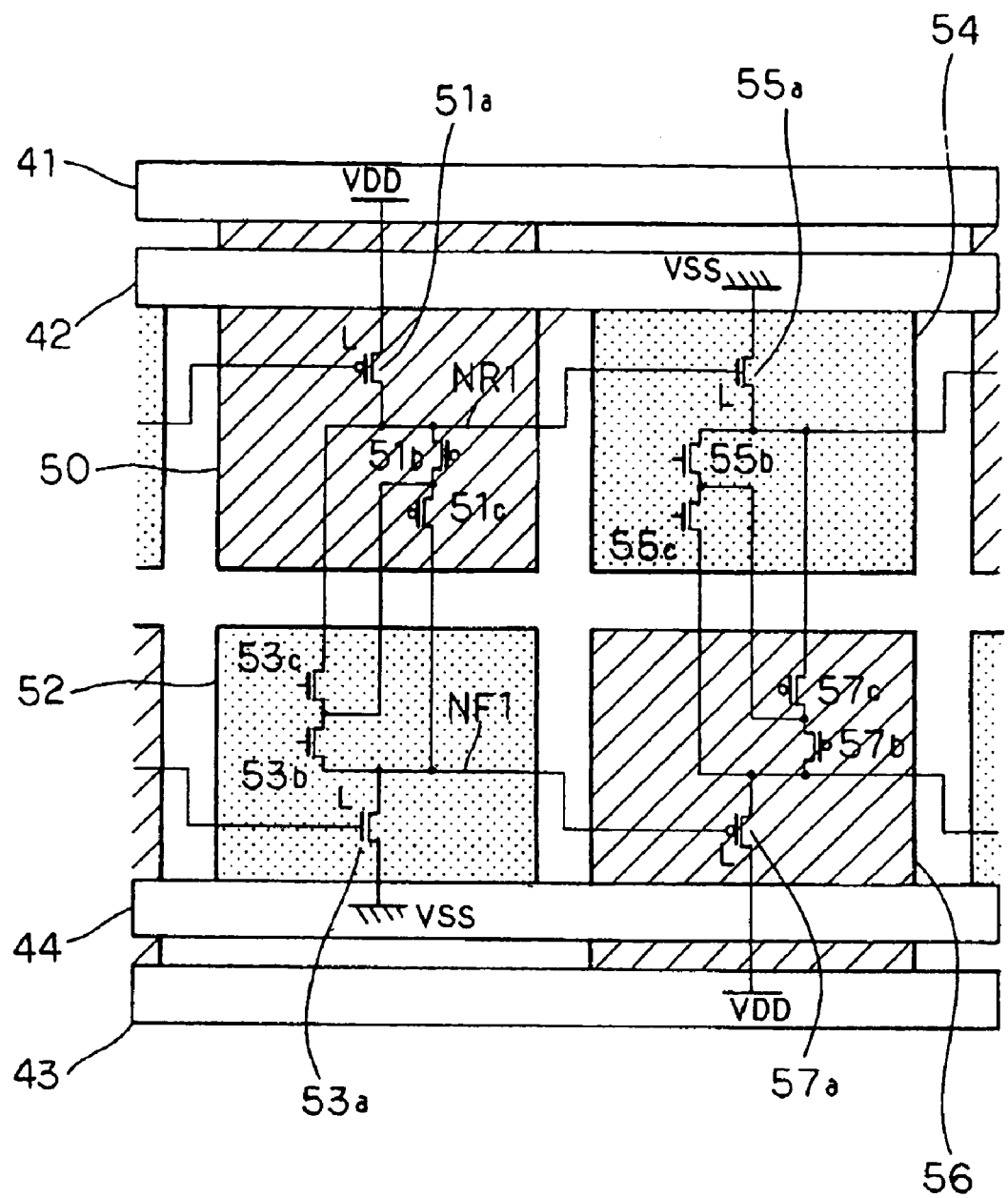
FIG. 40 is a layout of the logic circuit of the fourth working example.

FIG. 40 shows the layout of cut-off logic of the present working example.

As shown in FIG. 40, the logic circuit of the present working example includes; two NMOS formation regions 52 and 54; two PMOS formation regions 50 and 56; and VDD wiring 41 and 43 and VSS wiring 42 and 44 for supplying power supply VDD and power supply VSS to these MOS formation regions. The first-stage cut-off logic and second-stage cut-off logic are successively formed parallel to VDD wiring 41 and VSS wiring 44.

PMOS formation region 50 and NMOS formation region 52 of the first-stage cut-off logic are formed in vertical alignment in the region that is interposed between VDD wiring 41 and VSS wiring 44 on the left side of FIG. 40. NMOS formation region 54 and PMOS formation region 56 are formed in vertical alignment in the region that is interposed between VSS wiring 42 and VDD wiring 43 on the right side of FIG. 40.

By means of the above-described arrangement, NMOS formation region 54 of the second-stage cut-off logic is formed to the right of first-stage PMOS formation region 50. In addition, PMOS formation region 56 of the second-stage cut-off logic is formed to the right of NMOS formation region 52 of the first-stage cut-off logic.

To prevent latch-up, a prescribed distance is provided between each of the MOS formation regions and element isolation parts are provided between these regions. In addition, MOS formation regions signify well formation regions in which impurity diffusion layers and active layers of the drains and sources of the transistors are formed.

PMOS transistors 51a, 51b, and 51c are formed in first-stage PMOS formation region 50. NMOS transistors 53a, 53b, and 53c are formed in NMOS formation region 52. PMOS transistor 51a and NMOS transistor 53a are low-threshold transistors.

PMOS transistors 57a, 57b, and 57c are formed in second-stage PMOS formation region 56. NMOS transistors 55a, 55b, and 55c are formed in NMOS formation region 54. PMOS transistor 57a and NMOS transistor 55a are low-threshold transistors. The connections of each of the first-stage and second-stage transistors are as for the cut-off inverter shown in FIG. 7, and detailed explanation is therefore here omitted.

As described above, NMOS formation region 54 is formed to the right of and separated by a prescribed distance from PMOS formation region 50, and PMOS formation region 56 is formed to the right and separated by a prescribed distance from NMOS formation region 52. As a result, the signal line of signal NR1 that is applied as input to the gate of second-stage NMOS transistor 55a from the drain of first-stage PMOS transistor 51b does not intersect the signal line of signal NF1 that is applied as input to the gate of second-stage PMOS transistor 57a from the drain of first-stage NMOS transistor 53a.

The wiring that was employed in the circuit diagram shown in FIG. 3 was the so-called "cross-wiring" in which the PMOS-side output is applied as input to the NMOS gate of the next stage and the NMOS-side output is applied as input to the PMOS gate of the next stage. Accordingly, in the case of a layout in which a PMOS region of multi-stage cut-off logic is provided on the upper or lower side and an NMOS region is provided on the other side, the PMOS-side output wiring and the NMOS-side output wiring inevitably intersect, the output wiring of one necessarily temporarily switching to the other wiring layer. Wiring is normally laid out in aluminum with tungsten being used only in these regions of intersection. In this case, the resistance of tungsten is more than ten times greater than that of aluminum and therefore causes of wiring delay.

To circumvent this problem in the present working example, a configuration can be realized in which intersection of wiring is eliminated by alternately arrangement of the PMOS regions and NMOS regions for each logic. In the layout shown in FIG. 40, the wiring length between terminals differs but if the average wiring length is found and compared to the prior art, a shortening of wiring length on the order of $1/\sqrt{2}$ can be obtained. This shortening of wiring length not only enables an increase in operation speed, but also allows a reduction of the power consumption resulting from charge/discharge as compared with the prior art.

WORKING EXAMPLE 5

Figure 41A:
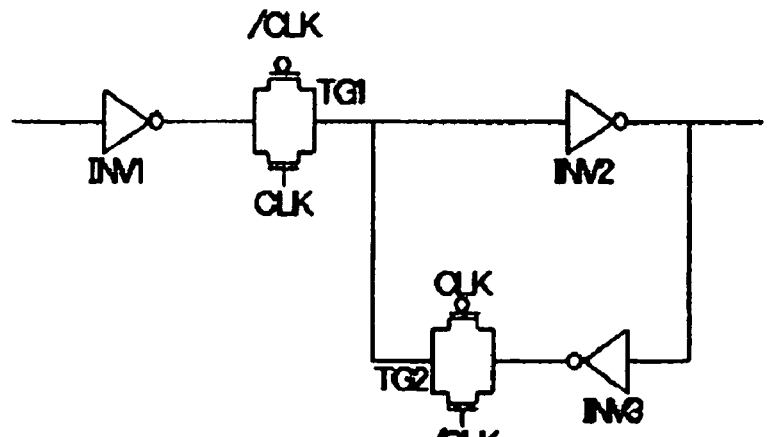
FIGS. 41A and 41B are circuit diagrams showing the logic circuit of the fifth working example.
Figure 41B:
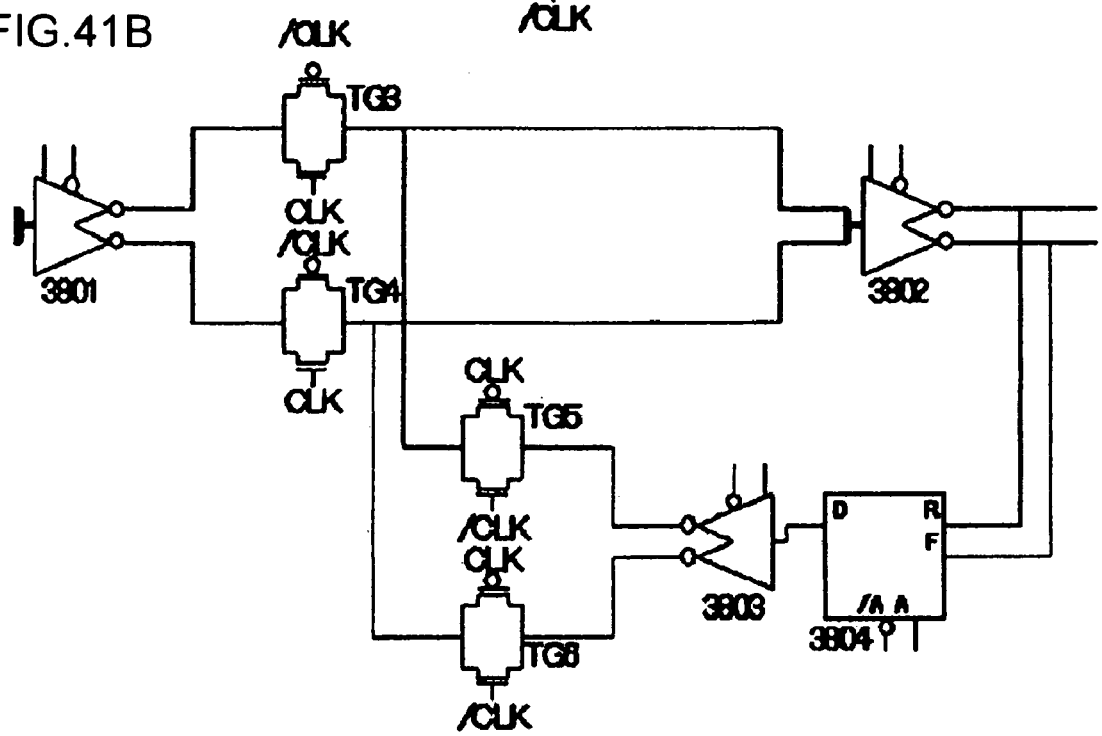

FIGS. 41A and 41B show examples of using cut-off logic to form a data latch circuit. FIG. 41A shows a D-F/F (D-flip-flop) of the prior art, and FIG. 41B shows a D-F/F of the present working example.

As shown in FIG. 41A, the D-F/F of the prior art includes: inverter INV1 for inverting an input signal from the outside; transfer gate TG1 for controlling the timing of the output from inverter INV1; inverter INV2 for inverting the signal that is applied as input by way of transfer gate TG1 and supplying the result to the outside; and inverter INV3 and transfer gate TG2 for feeding back the output signal of inverter INV1 to inverter INV2.

The D-F/F of the present working example shown in FIG. 41B includes, corresponding to each logic gate of FIG. 41A: cut-off inverter 3801 for inverting input signals from the outside; transfer gates TG3 and TG4 for controlling the timing of the output from cut-off inverter 3801; cut-off inverter 3802 for inverting the signal that is received by way of transfer gates TG3 and TG4 and supplying the result to the outside; and signal feedback unit for feeding back the output signal of cut-off inverter 3801 to cut-off inverter 3802. The signal feedback unit includes: high-speed transition detection/holding circuit 3804 for wave-shaping the output signal from cut-off inverter 3802 to produce one signal; cut-off inverter 3803 for inverting the output signal from high-speed transition detection/holding circuit 3804; and transfer gates TG5 and TG6 for controlling the timing the output from cut-off inverter 3803.

Explanation next regards the operation of D-F/F of the present working example.

A one-shot high signal of a CLK causes the high-speed transition signal and low-speed transition signal from cut-off inverter 3801 to be transferred to cut-off inverter 3802, and the resulting output undergoes wave-shaping in the high-speed transition detection unit of high-speed transition detection/holding circuit 3804. This output signal passes by way of cut-off inverter 3803, and when CLK is "low," passes by way of TG5 and TG6 and then held.

During cut-off, the rise-side high-speed transition output of cut-off inverter 3801 becomes "high" and the fall-side high-speed transition output becomes "low." The CLK signal becomes "low," and the output of cut-off inverter 3801 and the input of cut-off inverter 3802 are therefore separated by transfer gates TG3 and TG4. However, TG3 and TG4, being high-speed logic, often employ low-threshold voltages, and the sub-threshold leak current therefore causes the output of cut-off inverter 3801 and the input of cut-off inverter 3802 to transiently become the same potential. In addition, because the rise-side high-speed transition signal of cut-off inverter 3803 is "high" and the fall-side high-speed transition signal is "low," the output of cut-off inverter 3801 becomes the same potential as the input of cut-off inverter 3802. At this time, latch data are held in high-speed transition detection/holding circuit 3804, and when the ACT signal returns to "high" and the operation state is attained, the held data are supplied by way of cut-off inverter 3803 and transfer gates TG5 and TG6 as output from cut-off inverter 3802. It can therefore be seen from the present working example that even when cut-off logic is applied to the transfer gates, the data latch circuit can be realized by combining the configuration described in the embodiment.

As described above, the logic gates and logic circuits of the present invention minimize drops in the power supply of CMOS logic and reduce reductions of speed even when low-threshold transistors are used in the logic gates to increase speed, and the present invention can therefore bring about operation at higher speed than in the prior art.

In addition, by reducing the charge/discharge current of the gates for controlling cut-off, the present invention can obtain a decrease in power consumption as compared to the prior art. The present invention can further reduce the wiring charge/discharge current by eliminating the wiring discharge that occurred during cut-off in the prior art and holding data. The present invention can further, by reducing the size of the cut-off transistor gates and reducing the wiring charge/discharge current, shorten the recovery time when returning from the cut-off state to the operation state.

Finally, the logic gates and logic circuits of the present invention can be generally applied to semiconductor devices. The effect of the present invention is particularly evident in semiconductor devices that require low voltage and low power consumption.

While preferred embodiments of the present invention have been described using specific terms, such description is for illustrative purposes only, and it is to be understood that changes and variations may be made without departing from the spirit or scope of the following claims.

What is claimed is:

1. A logic gate comprising:
 a first transistor for receiving a first voltage at its source, receiving a first input signal at its gate, and supplying a first output signal from its drain;
 a second transistor for receiving at its source a second voltage that is lower than said first voltage, receiving a second input signal at its gate, and supplying a second output signal from its drain; and
 a connection-switching unit that is connected between the drains of said first transistor and said second transistor for connecting or cutting off said first transistor and said second transistor;
 said connection-switching unit including two or more transistors connected in parallel with respect to each other, each of said two or more transistors having a higher threshold voltage than a threshold voltage of said first transistor and a threshold voltage of said second transistor.

2. The logic gate according to claim 1, wherein a control signal is applied as input to a gate of a particular transistor of said two or more transistors to turn ON said particular transistor during operation and to turn OFF said particular transistor during standby.

3. The logic gate according to claim 2, further comprising:
 a third transistor that is connected in parallel to said first transistor for receiving said control signal at its gate and receiving said first voltage at its source; and
 a fourth transistor that is connected in parallel to said second transistor for receiving said control signal at its gate and receiving said second voltage at its source.

4. The logic gate according to claim 1, wherein said first input signal and said second input signal are identical.

5. The logic gate according to claim 1, wherein said first input signal is different from said second input signal.

6. The logic gate according to claim 1,
 wherein said first input signal is a fall-side high-speed transition signal such that a transition at a fall-side of said first input signal occurs at a higher speed than a transition at a rise-side of said first input signal; and wherein said second input signal is a rise-side high-speed transition signal such that a transition at a rise-side of said second input signal occurs at a higher speed than a transition at a fall-side of said second input signal.

7. The logic gate according to claim 6,
wherein said first output signal is a rise-side high-speed transition signal such that a transition at a rise-side of said first output signal occurs at a higher speed than a transition at a fall-side of said first output signal; and
wherein said second output signal is a fall-side high-speed transition signal such that a transition at a fall-side of said second output signal occurs at a higher speed than a transition at a rise-side of said second output signal.

8. The logic gate according to claim 1,
said first transistor connected to supply said first output signal to a circuit that is different from said connection-switching unit; and
said second transistor connected to supply said second output signal to said circuit.

9. The logic gate according to claim 1,
wherein one of said two of more transistors is connected to receive a control signal; and
wherein another one of said two or more transistors is connected to receive an inverse of said control signal.

10. A logic circuit comprising:
a logic gate comprising:
   a first transistor for receiving a first voltage at its source, receiving a first input signal at its gate, and supplying a first output signal from its drain;
   a second transistor for receiving at its source a second voltage that is lower than said first voltage, receiving a second input signal at its gate, and supplying a second output signal from its drain; and
   a connection-switching unit that is connected between the drains of said first transistor and said second transistor for connecting or cutting off said first transistor and said second transistor; and
a detection/holding circuit that is connected to said logic gate for wave-shaping said first output signal and said second output signal that are received from said logic gate to supply one signal to an outside.

11. The logic circuit according to claim 10, wherein said detection/holding circuit includes:
   a detection unit for detecting said first output signal and said second output signal;
   a holding unit for holding signals that are to be supplied to the outside during standby of said logic gate in accordance with signals supplied from said detection unit;
   an output unit for, during operation of said logic gate, supplying to the outside, of said first output signal and said second output signal received from said detection unit, the signal that is received first, and during standby of said logic gate, supplying to the outside a signal that is held in said holding unit.

12. A logic circuit comprising:
a plurality of logic gates, each of said plurality of logic gates comprising:
   a first transistor for receiving a first voltage at its source, receiving a first input signal at its gate, and supplying a first output signal from its drain;
   a second transistor for receiving at its source a second voltage that is lower than said first voltage, a second input signal at its gate, and supplying a second output signal from its drain; and
   a connection-switching unit that is connected between the drains of said first transistor and said second transistor for connecting or cutting off said first transistor and said second transistor;
said plurality of logic gates including a first logic gate and a second logic gate that is connected to said first logic gate;
wherein said first output signal of said first logic gate is applied as input to the gate of said second transistor of said second logic gate; and
wherein said second output signal of said first logic gate is applied as input to the gate of said first transistor of said second logic gate.

13. The logic circuit according to claim 12, comprising:
a first power supply line for supplying said first voltage; and
a second power supply line that is provided parallel to said first power supply line for supplying said second voltage;
wherein said first logic gate and said second logic gate are successively arranged along said first power supply line in a region that is interposed between said first power supply line and second power supply line;
wherein, for each of said first logic gate and said second logic gate, a formation region of said first transistor and a formation region of said second transistor are arranged separated by a prescribed distance in a direction perpendicular to said first power supply line; and
wherein an order of arrangement of the formation region of said first transistor and the formation region of said second transistor is reversed for said first logic gate and said second logic gate.

* * * * *